(12) United States Patent
Dai et al.

(10) Patent No.: US 8,448,117 B2
(45) Date of Patent: May 21, 2013

(54) ADAPTIVE MESH RESOLUTION IN ELECTRIC CIRCUIT SIMULATION AND ANALYSIS

(75) Inventors: Wenliang Dai, Shanghai (CN); Zhongyong Zhou, Shanghai (CN); Zhangmin Zhong, Shanghai (CN)

(73) Assignee: Cadence Design Systems, Inc., San Jose, CA (US)

( * ) Notice: Subject to any disclaimer, the term of this patent is extended or adjusted under 35 U.S.C. 154(b) by 335 days.

(21) Appl. No.: 12/610,948

(22) Filed: Nov. 2, 2009

(65) Prior Publication Data

US 2010/0205572 A1    Aug. 12, 2010

(51) Int. Cl.
*G06F 17/50*    (2006.01)

(52) U.S. Cl.
USPC .......................... 716/120; 716/110; 716/111

(58) Field of Classification Search
USPC ........................................................ 716/120
See application file for complete search history.

(56) References Cited

U.S. PATENT DOCUMENTS

| | | | | |
|---|---|---|---|---|
| 6,532,439 | B2 * | 3/2003 | Anderson et al. | 703/14 |
| 7,277,841 | B1 * | 10/2007 | Novak et al. | 703/18 |
| 8,065,101 | B2 * | 11/2011 | Nishino et al. | 702/66 |

OTHER PUBLICATIONS

Chitwood, Sam; Zheng, Ji; "IR DROP in High-Speed IC Packages and PCBs," Apr. 2005, Printed Circuit Design and Manufacture.*

* cited by examiner

*Primary Examiner* — Vuthe Siek
*Assistant Examiner* — Eric Lee
(74) *Attorney, Agent, or Firm* — Holland & Knight LLP; Mark H. Whittenberger

(57) ABSTRACT

An adaptive mesh of virtual nodes is provided to analyze the performance of a power/ground plane pair having an irregular shape. Plane transmission line characteristics and regional modal resonances can be modeled accurately, and with a significant decrease in simulation time as compared to traditional methods. A variable-sized cell structure is constructed with smaller cells in irregular regions and with larger cells in uniform regions. Grid nodes may thus stay aligned along length and width to allow parameters of equivalent circuit models to be scaled appropriate to the cell size.

15 Claims, 25 Drawing Sheets

ADAPTIVE MESH RESOLUTION IN ELECTRIC CIRCUIT SIMULATION AND ANALYSIS

This application claims priority from Chinese application number 200910006283.X, filed Feb. 11, 2009, entitled "Adaptive Mesh Resolution in Electric Circuit Simulation and Analysis."

BACKGROUND OF THE INVENTION

The present general inventive concept is directed toward adaptive spatial resolution of mesh nodes in simulating electric circuits during the design phase thereof. The present general inventive concept finds application in simulating the electrical behavior of split plane electrical circuits through a mesh of linked nodes, the spatial resolution of which is adapted in accordance with the shape of the planes forming the electrical circuit.

Split plane power distribution is a common circuit configuration to distribute electrical power to functional components of a broader electrical circuit design. As illustrated in FIG. 1A, split plane power distribution is generally implemented by a power plane 110 and a ground plane 120, the combination of which will be referred to herein as a power/ground plane pair (PGPP) 100. Typically, the power plane 110 and the ground plane 120 are spaced apart in planar parallel alignment, and are separated by a dielectric medium.

Typically, split-plane power distribution networks must accommodate extremely rapid switching times of current across its domain. As these switching times are ever increasing from one generation of circuits to another, power integrity (PI) analysis has become a focus of circuit designers, whereby the power distribution network can be simulated and modified in the design phase. Due to the geometry of the PGPP and the switching times involved, transmission line modeling is typically employed to analyze the frequency dependent characteristics of the PGPP during the design stage so that prudent design measures can be taken. For example, as illustrated in FIG. 1B, a PGPP model 130 includes a plurality of transmission line segment models 140 each contained within a cell 135. When the PGPP model 130 is executed, a frequency response of the PGPP can be analyzed. Accordingly, when resonance is apparent in the impedance profile at some frequency, for example, the designer may add capacitive elements at certain points in the PGPP to favorably alter the resonant frequency components of the power distribution network. Since, through PI analysis, such modification can be achieved at the design phase and prior to the fabrication of an actual circuit, the time to market of a product using the circuit can be decreased considerably.

Whereas, it is not difficult to model a simple plane pair transmission line, the abstract shapes of typical PGPPs result in complex boundaries some of which may be internal to the exterior boundary of the PGPP. For example, as illustrated in FIG. 1B, many PGPP models, such as PGPP model 130, are implemented in a uniform mesh of cells 135 so that complex shapes can be accommodated. Consequently, an extremely large number of cells 135 may be needed to populate the entirety of the PGPP model 130. While several algorithms can be used to model the complex shapes of a PGPP, the computational overhead for these algorithms are prohibitive, especially where such PI analysis tools must share computational resources with other design tools.

BRIEF SUMMARY OF THE INVENTION

There is an apparent need for PI analysis tools of PGPPs and similar structures that reduce the computational overhead thereof.

The present general inventive concept provides apparatus and methods to form an adaptive mesh of virtual nodes to analyze the performance of a power/ground plane pair having an irregular shape. Plane transmission line characteristics and regional modal resonances can be modeled accurately, and with a significant decrease in simulation time as compared to traditional methods.

A variable-sized cell structure may be constructed, with smaller cells in irregular regions and with larger cells in uniform regions. The variable-sized cell structures may be meshed together horizontally and vertically, along virtual grid nodes. The alignment of the nodes of the variable-sized cells may allow the parameters of equivalent circuit models to be scaled appropriate to the cell size.

Additional aspects and utilities of the present general inventive concept will be set forth in part in the description which follows and, in part, will be obvious from the description, or may be learned by practice of the general inventive concept.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE INVENTION

Figure 1A:
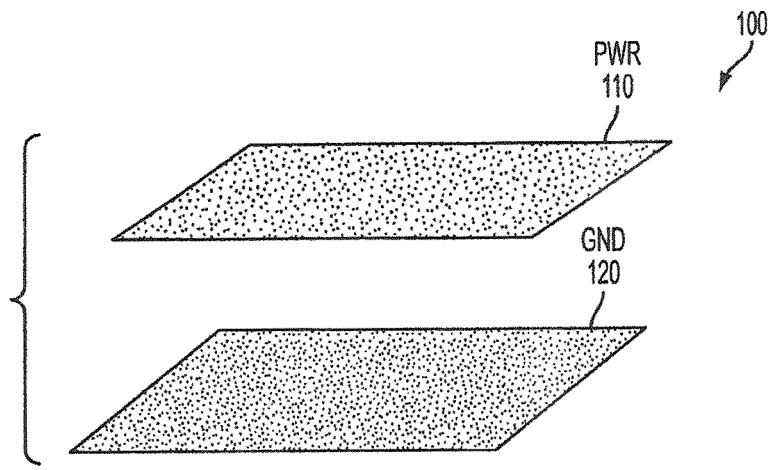
FIG. 1A is an illustration of a conventional rectangular power plane/ground plane pair.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Figure 2A:
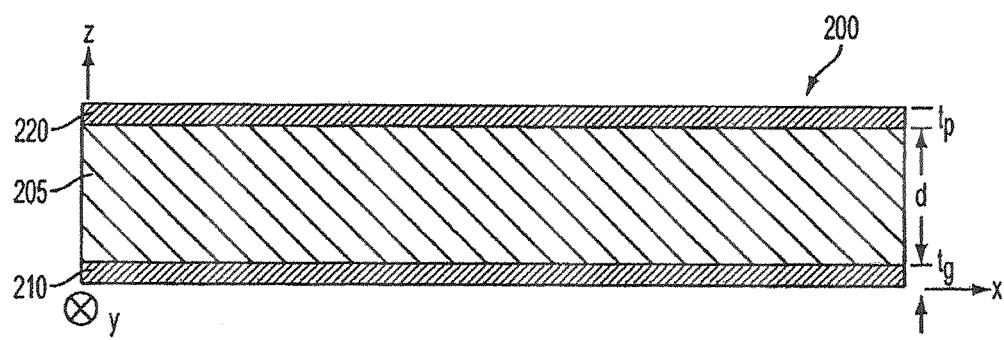
FIG. 2A illustrates a cross-sectional view of a power plane/ground pair according to the general inventive concept.
Figure 2B:
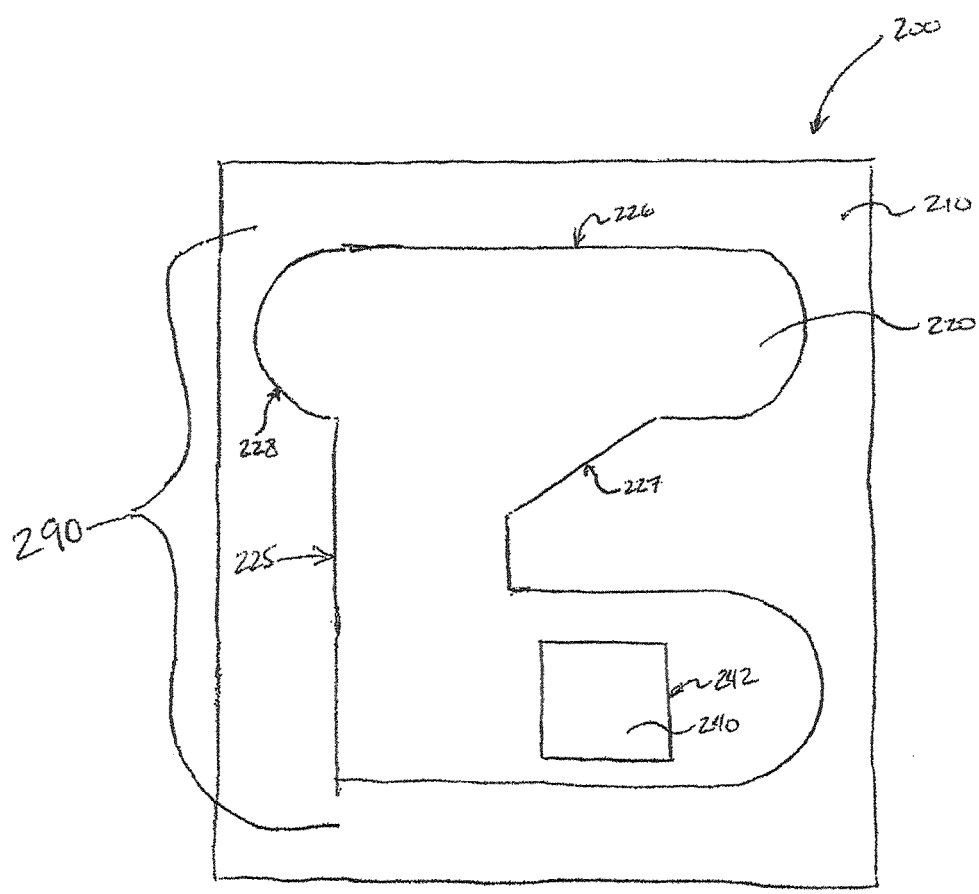
FIG. 2B illustrates a Region of Interest (ROI) of the power/ground plane pair illustrated in FIG. 2A.
Figure 2C:
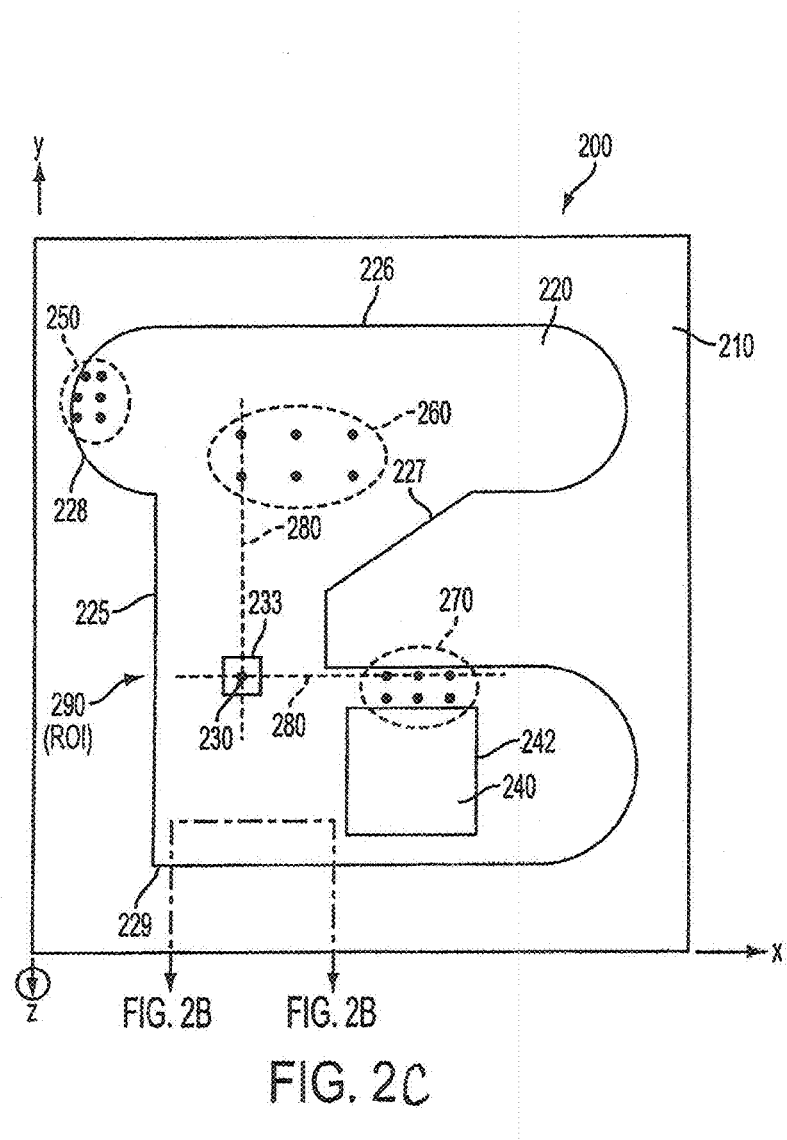
FIG. 2C illustrates virtual nodes and their spacing in the ROI illustrated in FIG. 2B.

FIGS. 2A-2C illustrate a general power/ground plane pair (PGPP) 200 to demonstrate general features of the present general inventive concept. It is to be understood that while certain descriptions herein are presented as though various lines, grids, points, axes and other geometric features are physically drawn or rendered, such description is to provide succinct explanation of the present general inventive concept in general. The geometric operations described herein may be carried out by suitable machine operations, as will be exemplified by embodiments below.

As illustrated in FIG. 2A, the PGPP 200 includes a ground plane 210 of thickness $t_g$ and a power plane 220 of thickness $t_p$ parallel to and separated from the ground plane 210 by a distance d. Although the ground plane 210 is illustrated in FIGS. 2B and 2C as a continuous rectangle, i.e., without a void within its boundary, the present general inventive concept is not limited thereto as will be appreciated by the skilled artisan upon review of this disclosure. As illustrated in FIG. 2A, the region between the power plane 220 and the ground plane 210 may be occupied by a material 205 having an electrical permittivity $\in_d$. For purposes of description and not limitation, it is to be assumed that the PGPP is aligned in a coordinate system, such as the Cartesian coordinates system illustrated in FIGS. 2B and 2C, and that the coordinate system is compatible with an addressing scheme of a machine performing simulations and analyses of the PGPP 200.

As illustrated in FIG. 2B, the general shape of the power plane 220 is defined as a peripheral boundary, such as indicated at peripheral boundary 229. The peripheral boundary 229 may include different protrusions, cutouts, linear and curved segments, and other such features. For example, as illustrated in FIG. 2B, the boundary 229 may include a vertical boundary segment 225, where the term vertical refers to a linear segment aligned parallel with the y-axis, a horizontal boundary segment 226, where the term horizontal refers to a linear segment aligned parallel with the x-axis, linear boundary segment 227, and arcuate boundary segment 228. It is to be understood that the peripheral boundary 229 may include segments of shapes other than those illustrated herein without deviating from the spirit and intended scope of the present general inventive concept.

As illustrated in FIGS. 2B and 2C, the power plane 220 may include one or more voids, such as illustrated at void 240, that lie within the area bound by the peripheral boundary 229. Although the void 240 is illustrated as being defined by a rectangular void boundary 242 in the power plane 220, voids in the power plane 220 and the ground plane 210 may exist and may be defined by a boundary of any shape without deviating from the spirit and intended scope of the present general inventive concept.

A region of interest (ROI) 290, illustrated, for example, in FIG. 2B, is formed by the geometrical intersection of the area of the power plane 220 and that of the ground plane 210. In the example of FIG. 2B, the ROI 290 includes the area that is bound by the peripheral boundary 229, minus the area bound by the void boundary 242. In other words, the ROI 290 includes the area of power plane 220, but does not include the area of void 240. It is to be understood that the ROI 290 being equivalent to the area of the power plane 220 is a consequence of the continuous area of the ground plane 210 and, thus, the ROI 290 would be smaller than the area of the power plane 220 if the ground plane had voids therein, or did not extend beyond the boundary 225 of the power plane 220.

In certain embodiments of the present general inventive concept, the ROI 290 is the region in which a chosen analysis technique is valid, regardless of the particular geometries of the individual components forming an actual circuit. For example, if the chosen analysis technique employs an equivalent circuit model such as a transmission line equivalent circuit, then the ROI would include the regions in which the geometry of the system (the parallel planes of the ground plane 210 and the power plane 220 in the example of FIG. 2B) is such that the transmission line equivalent circuit is valid and provides a reasonable approximation of the true behavior of the system. Of course, in certain embodiments of the present general inventive concepts, adjustments or additional models may be incorporated to provide greater accuracy, such as to treat edge effects. However, in applications such as power integrity (PI) analysis, the present general inventive concept provides sufficient accuracy without such treatment.

As illustrated in FIG. 2C and in accordance with embodiments of the present general inventive concept, virtual nodes, such as is representatively illustrated at virtual node 230, are placed in the ROI 290. As used herein, a virtual node is a location on a conductor as opposed to a physical node that forms a connection between conductive elements, such as a terminal of a physically realizable circuit element or a junction of conductive elements. A virtual node may be physically remote from connection with a physical circuit element, but may act as a physical node with regard to certain analysis techniques, such as forming interconnections of mesh of equivalent circuit models, as is described in exemplary embodiments below. A virtual node may also define a point at which mathematical operations are evaluated in a numerical modeling process. For example, in addition to the equivalent circuit modeling described below, a configuration of virtual nodes constructed in accordance with the present general inventive concept may be used to evaluate the power distribution circuit 200 by such numerical analysis techniques as finite-difference time domain modeling, the finite element method, and the method of moments.

In accordance with embodiments of the present general inventive concept, any number of the virtual nodes 230 are placed to conform to any arbitrary shape in a manner that reduces the number of mesh points required by conventional techniques. For example, as illustrated in FIG. 2C, in areas of the ROI 290 in which complex boundaries are located, such as indicated by the region 250, the spacing of virtual nodes 230 may be small, while in areas of the ROI 290 in which such complex boundaries are absent, such as indicated by the region 260, the spacing between virtual nodes 230 may be increased. The spacing may also be smaller in one direction than in another to accommodate boundaries aligned in a single direction, such as illustrated by the region 270. Accordingly, the entire ROI 290 may be adaptively populated with virtual nodes 230 to decrease the number of points at which the circuit is to be analyzed. The adaptive mesh embodied in accordance with the present general inventive concept decreases the amount of storage capacity, and also decreases the number of computations to analyze the power distribution circuit 200. In certain embodiments of the present general inventive concept, the virtual nodes 230 are aligned in accordance with a coordinate system, such as the Cartesian system illustrated in FIG. 2C, as illustrated by the alignment lines 280. For example, the may allow the grid nodes to stay aligned along a length and width to allow parameters of equivalent circuit modes to be scaled appropriately to the cell size.

In certain embodiments of the present general inventive concept, the virtual nodes 230 are contained in an area defining a cell around each node, such as the cell 233. As used herein, a cell is a definition of a region that can be divided into other cells and/or joined with adjacent cells to form a single cell. The cell is neither limited to the size nor the shape of the cell 233 illustrated in FIG. 2C, and may be any suitable shape. The cell 233 may be aligned and sized in accordance with embodiments of the present general inventive concept so that electrical parameters of a model of the region 233 can be defined by only by the dimensions of the cell and the physical construction of the PGPP 200, which may be constant across all cells. When such a model is constructed based on the virtual nodes 230 populating ROI 290, analysis of the electrical characteristics of the entire ROI 290 of PGPP 200 can be performed.

Figure 3A:
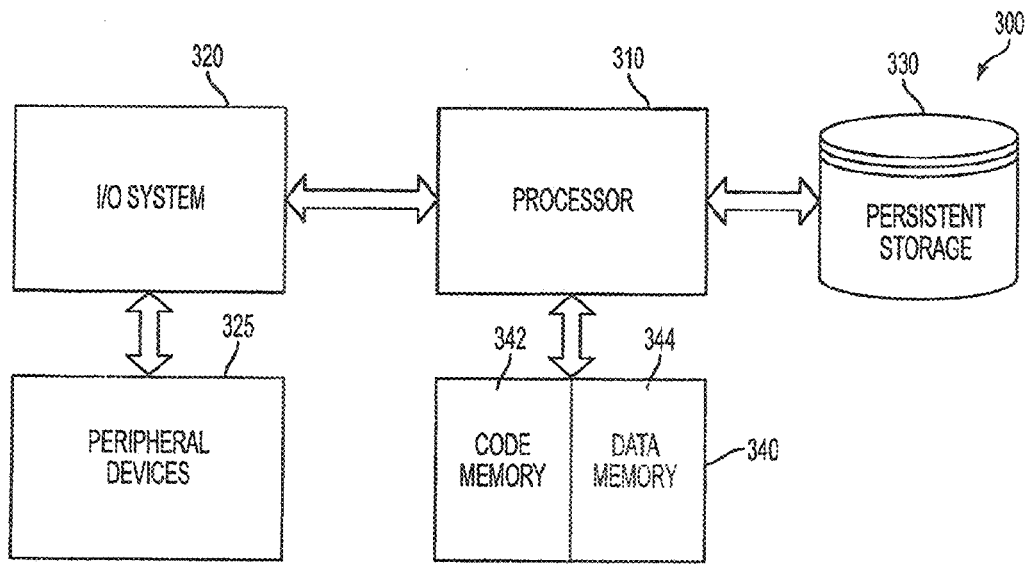
FIGS. 3A-3B are block diagrams illustrating exemplary system configurations on which the present general inventive concept may be practiced.

FIG. 3A illustrates an exemplary embodiment of a system configuration suitable to practice the present general inventive concept. An exemplary data processing apparatus 300 of FIG. 3A includes an input/output (I/O) system 320, through which the data processing apparatus 300 may communicate with peripheral devices, collectively represented at block 325, and/or with external network devices. The exemplary data processing apparatus 300 of the embodiment illustrated in FIG. 3A includes a processor 310 to direct the interoperation of the components of the data processing apparatus 300, and to execute processing instructions that implement various functional modules, such as those described below with reference to FIG. 3B. Embodiments of the present general inventive concept are not limited to a particular hardware configuration or instruction set architecture of the processor 310, and may be configured by numerous structures that perform equivalently to those illustrated and described herein. Moreover, it is to be understood that while the processor 310 is illustrated as a single component, certain embodiments of the present general inventive concept may include distributed processing implementations through multiple processing elements. The present general inventive concept is intended to embrace all such alternative implementations, and others that will be apparent to the skilled artisan upon review of this disclosure.

A storage unit 340 may be utilized to store data and processing instructions on behalf of the exemplary data processing apparatus 300 of FIG. 3A. The storage unit 340 may include multiple segments, such as a code memory 342 to maintain processor instructions to be executed by the processor 310, and data memory 344 to store data, such as data structures on which the processor 310 performs data manipulation operations. The storage unit 340 may include memory that is distributed across components, to include, among others, a cache memory and a pipeline memory.

The data processing apparatus 300 may include a persistent storage system 330 to store data and processing instructions across processing sessions. The persistent storage system 330 may be implemented in a single persistent memory device, such as a hard disk drive, or may be implemented in multiple persistent memory devices, which may be interconnected by a communication network.

It is to be understood that although the functional compartmentalization of the exemplary embodiment of FIG. 3A facilitates an understanding of the present general inventive concept through descriptions thereof, such configuration is not essential to practice the present general inventive concept. Elements other than those illustrated and described may be used in place thereof, functionality portrayed as being carried out in multiple elements may be combined to be carried out in a single component, and elements described as discrete may be distributed across multiple components. Indeed, numerous variations, alternatives and modifications will become apparent to the skilled artisan upon review of this disclosure and the present general inventive concept is intended to encompass such alternative configurations.

Figure 3B:
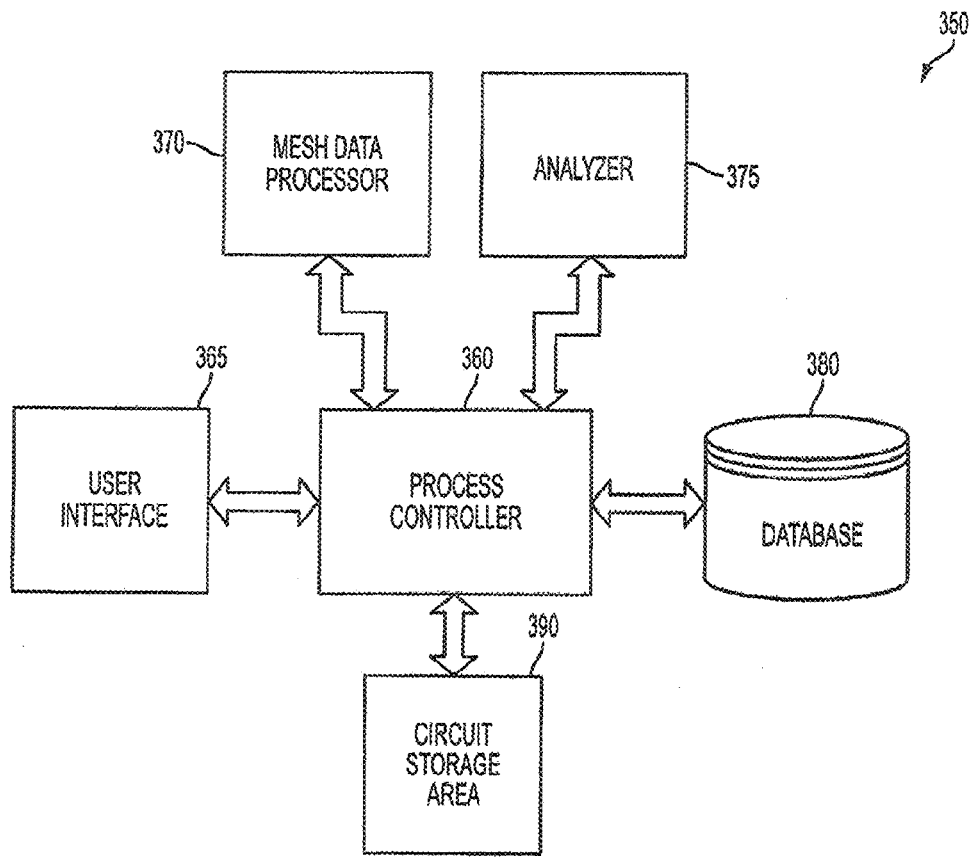

FIG. 3B illustrates an exemplary configuration of functional components suitable to practice certain embodiments of the present general inventive concept. The system illustrated in FIG. 3B may be implemented through processing instructions executed on the processor 310, and in cooperation with other components as illustrated in FIG. 3A, form a power integrity analysis system (PIAS) 350 on the data processing apparatus 300. The PIAS 350 may be operated by a circuit designer to analyze circuit designs so that appropriate design decisions can be made. The PIAS 350 operates on data, as opposed to on a physically fabricated circuit, that may include data formatted to physically fabricate the circuit on one or more circuit-bearing media, such as data to construct component and interconnect mask patterns, component placement location data, packaging data, and any other data necessary in a fabrication process to produce the finished circuit product. The present general inventive concept is not limited by any particular fabrication process, and any suitable fabrication data format may be used with the present general inventive concept without deviating from the spirit and intended scope thereof.

The PIAS 350 may include a process controller 360 to coordinate and control the interoperations of the functional components of the PIAS 350 so as to achieve a fully operational data processing system. For example, the process controller 360 may receive data corresponding to user manipulations of the user interface 365, may format the data into a command and/or data location in memory, and may convey such information to the applicable functional module of the PIAS 350. The process controller 360 may subsequently receive processed data from the applicable functional module and forward the data to another functional module, as well as to indicate such processing on the user interface 365. The process controller 360 will perform other coordination and control operations according to the implementation of the PIAS 350, and such other operations, as well as the implementation of such, can be embodied by a wide range of well-known process control methods and devices. The present general inventive concept is intended to encompass all such alternatives of the process controller 360, including multi-threaded and distributed process control methodologies.

As indicated above, the PIAS 350 may include a user interface 365 through which the PIAS 350 interacts with a user thereof, typically a circuit designer. The peripheral devices 325 may include a display unit and one or more input devices such as a mouse, a track ball, a stylus, a touch screen, and/or a touchpad, among others. The combination of hardware devices and suitably programmed processing instructions executed by the processor 310 form the user interface 365. The user interface 365 is used in certain embodiments of the present general inventive concept to present data to the user in a meaningful form on a display, such as through images of circuit schematics, circuit layout diagrams, circuit test bench interfaces, data management interfaces such as file directories, and other images recognized by the user.

The user interface 365 may also interpret user manipulations of any input device into messages and instructions that can be recognized by the process controller 360. The user interface 365 may include a plurality of user controls to afford the user interactivity with and control over the PIAS 350. The user controls may include the input devices described above, and may also include software implemented controls on the display, such as buttons, menus of commands, text command entry blocks, and other suitable software controls. The foregoing description of the user interface 365 may be met by a suitably configured graphical user interface (GUI), the implementation details of such will be omitted for the sake of providing a concise description of the general inventive concept.

The PIAS 350 may include a database 380 of circuit objects that maintain all the data necessary to design, analyze, modify, and fabricate a circuit per the specifications of the designer. As used herein, a circuit object is a data structure that can be stored in a memory device to contain data of a circuit element so that the circuit element can be viewed, modified, interconnected with other circuit elements, and analyzed in one or more circuit design contexts selected by a user. Such may be achieved by a suitable data abstraction technique so that a particular circuit element may be, for example, presented as a schematic symbol in a schematic entry design context, presented as a footprint in a layout design context, presented as a routing component in a circuit routing design context, and provided as a component model in a circuit analysis and design verification context. A circuit object may also be hierarchical, whereby a circuit object contains other circuit objects of circuit elements interconnected to form a component that has a schematic symbol, layout footprint, and a terminal characteristics model used as a single element in a circuit. An example of such a circuit object is that of an operational amplifier. Similarly, an analysis object is a data structure that can be stored in a memory device to contain data of a non-circuit element, such as cell data, so that the non-circuit element can be viewed, modified, interconnected with other non-circuit elements, and analyzed in one or more circuit design contexts selected by a user. It is to be understood that in the descriptions below, unless otherwise made clear to the contrary, operations described below as being performed on a circuit element or a non-circuit element implies the operation being performed on the containing circuit object or analysis object, respectively, by the components of the PIAS 350.

It is to be understood that interconnection and power distribution components, such as terminal pads, wires, conductive traces and segments thereof, inter-layer vias, power planes, and ground planes, among others, are considered circuit elements per the definition given above, and may be contained in a corresponding circuit object in memory. Virtual nodes may also be stored in circuit objects, as well as any equivalent circuit model connected between virtual nodes. Moreover, circuit-bearing media are also circuit components that may be contained in a circuit object. Accordingly, a circuit designer may construct a power distribution circuit on a circuit-bearing medium of, for example, silicon, which has a known electric permittivity that may be stored in the circuit object of the circuit-bearing medium. Such physical constants and circuit component dimensions can be obtained from the circuit objects of the components forming a power distribution circuit to construct equivalent circuit models described below.

Circuit storage area 390 is a work space in memory, such as in data memory 344, in which to store circuit instances. As used herein, a circuit instance is a data structure in memory containing all of the circuit objects necessary to view, modify, analyze, and evaluate a circuit or sub-circuit. It is to be understood that although only a single circuit storage area is illustrated in FIG. 3B, any number of such storage areas may be used to provide the intended purposes as described herein without deviating from the spirit and intended scope of the present general inventive concept. Additionally, the circuit storage area may be defined as a static memory structure, or may be dynamically allocated. The present general inventive concept is not limited to particular implementations of the circuit storage area.

As illustrated in FIG. 3B, PIAS 350 may include a mesh data processor 370 to execute the operations necessary to place in memory, such as in circuit storage area 390, a plurality of virtual nodes at selected locations on a power distribution path. When the virtual nodes are linked, such as through an equivalent circuit model, the mesh data processor 370 may construct a netlist to define a structure of the interconnected mesh components, such as transmission line segment equivalent circuit models and resistive equivalent circuit models. The present general inventive concept is not limited by a particular implementation of any of the data processing functions of the mesh data processor 370, and any suitable function may be used with the present general inventive concept without deviating from spirit and intended scope thereof. The data processing functions to carry out the present general inventive concept will be described below as applicable; otherwise the implementation details thereof will be omitted for the sake of providing a concise description of the general inventive concept.

The exemplary PIAS 350 includes an analyzer 375 that produces analytical data obtained from simulations of the interconnected mesh components generated by the mesh data processor 375. The analyzer 375 may implement various analytical functions including, but not limited to, power integrity analysis. The present general inventive concept is not limited to a particular implementation of any of the analysis functions of the analyzer 375, and any suitable function that performs the intended purpose as described herein may be used with the present general inventive concept without deviating from spirit and intended scope thereof. Certain features of the analyzer 375 and the analysis functions to carry out the present general inventive concept will be described below as applicable; otherwise the implementation details thereof will be omitted for the sake of providing a concise description of the general inventive concept.

Portions of the PIAS 350 may be implemented by a suitable Electronic Design Automation (EDA) system having similar features as those described above. The present general inventive concept may be practiced by an existing EDA system having the novel features as described and incorporated herein. Such incorporation may be carried out by altering the flow of the EDA system, or may be incorporated as a functional module to interact with an existing EDA system through, for example, an Application Programming Interface (API), or other such mechanism.

In the paragraphs that follow, the present general inventive concept will be further described and explained through specific exemplary embodiments thereof. It is to be understood that although operations below are described as though graphic manipulations are occurring, such as constructing cells in a region of interest, such is for description purposes, and the underlying operations that are performed by coordinated processes of the PIAS 350 are implied, as would be appreciated by the ordinarily skilled artisan. Additionally, it is to be understood that while various processes are described by way of graphical depictions of intermediate operations, certain processes may be executed without a corresponding visual depiction on a display device.

Figure 4A:
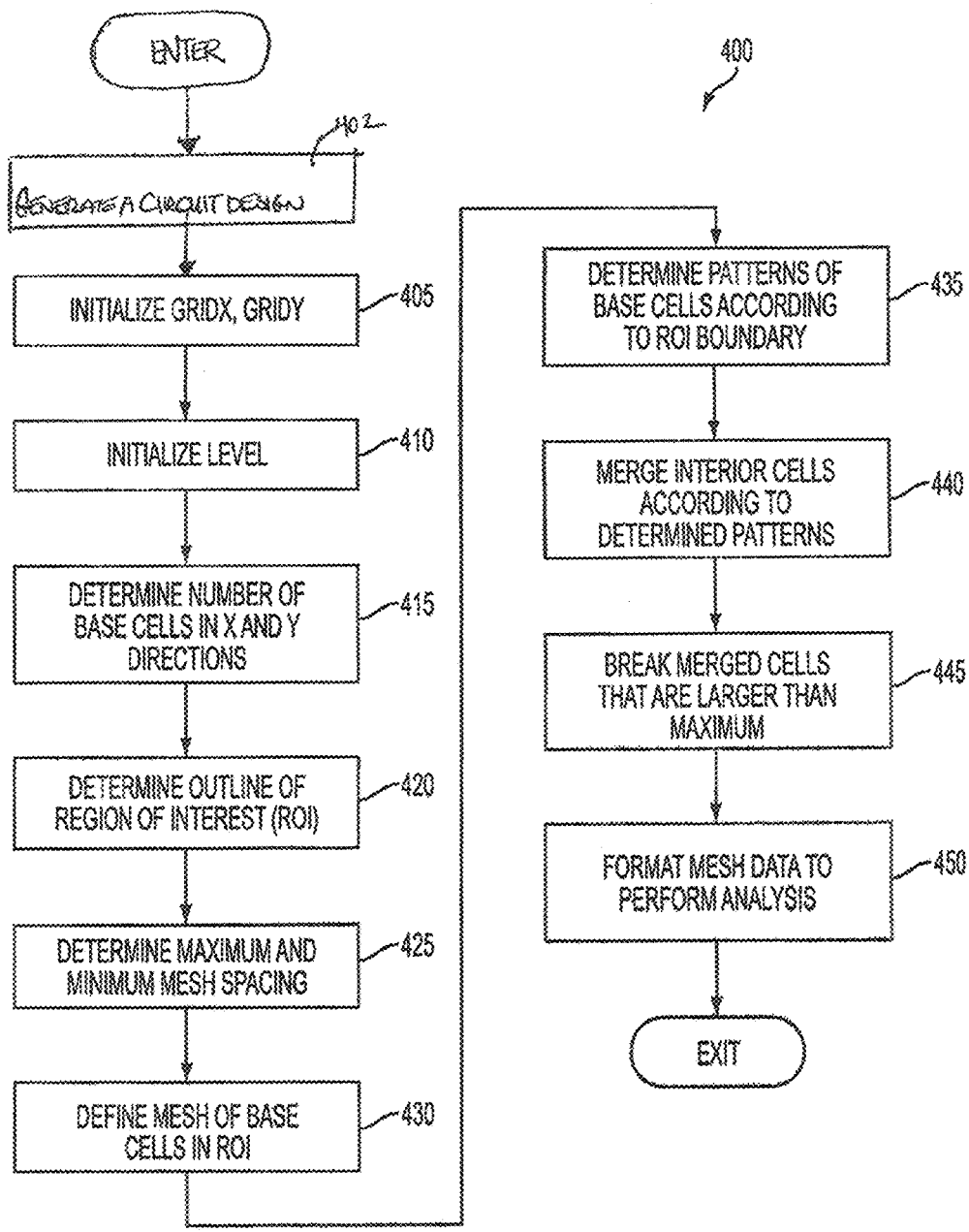
FIGS. 4A-4B are flow diagrams illustrating an exemplary process by which a region of interest of a power plane/ground plane pair may be tessellated according to embodiments of the present general inventive concept.

In FIG. 4A, there is illustrated a flow diagram of an exemplary process 400 to tessellate the ROI by a mesh of cells according to an embodiment of the present general inventive concept. The exemplary tessellation process 400 illustrated in FIG. 4A assumes a Cartesian coordinate system. However, the skilled artisan will recognize that the process is readily extendable to other geometries and coordinate systems thereof. It is to be understood, also, that the process 400 illustrated in FIG. 4A conveys general procedures for purposes of explanation that may be accomplished by suitable machine operations, such as programmed instructions executed on a computer platform like that illustrated in FIG. 3A. The general inventive concept may be carried out by operations other than those illustrated in FIG. 4A and/or in an order other than that illustrated in FIG. 4A, as will be appreciated by the skilled artisan.

Upon entry, and after generation of a circuit design at operation 402, the exemplary tessellation process 400 transitions to operation 405, whereby variables GridX and GridY are initialized to establish the number of major cells in the x and y directions, respectively. These values may be chosen by a circuit designer to provide a desired resolution at a desired accuracy in the analysis results. Additionally, in operation 410, the variable Level is initialized to establish the number of minor cells that can be divided from a major cell. The variable Level may also be used in the calculation of the size of the base cell, as discussed in further detail below. For example, if the GridX is 8 and the Level is 2, then the size of the base cell is ¹⁄₁₆ of the width of the outline.

As used herein, a major cell is the largest allowable subdivision of the ROI, and the minor cell is the smallest allowable subdivision in the ROI, and is alternatively referred to herein as a base cell. Accordingly, upon completion of the tessellation process 400, a cell can be no larger than a major cell and no smaller than a minor cell, but may be of any size therebetween.

In operation 415, the number of minor cells in the x and y directions is determined, such as by dividing Level into GridX and GridY. The exemplary process 400 then transitions to operation 420, whereby the boundaries of the ROI, e.g., the outer peripheral boundary and any interior peripheral boundaries are determined. For example, in FIG. 4C, regions A, B, C, D, E, and F are illustrated, where the regions may include voids, slots, or other features. Operation 420 may determine the interior and exterior boundaries (e.g., illustrated as boundary "G" in FIG. 4C) of the ROI. As stated above, the ROI is the geometrical intersection of the power plane and the ground plane, which may be acquired by suitable intersection determination technique. The outer peripheral boundary is then acquired from coordinates of the outer edges of the resultant shape of the ROI. The ROI may be stored in a circuit object to include the dimensions thereof, which can be used to obtain the coordinates of the boundaries in the coordinate system.

In operation 425, the maximum and minimum mesh spacing is determined. The minimum spacing may be determined by computing the number of base cells that will completely populate the ROI in the x and y directions. Similarly, the maximum mesh spacing may be determined from the number of major cells that will populate the ROI. The mesh spacing determines the placement of cells within the ROI, as will be described below.

As is illustrated in FIG. 4A, the exemplary process 400 transitions to operation 430, whereby a mesh of base cells is defined in the ROI. The present general inventive concept is not limited by the construction of the base cell mesh, however, for purposes of illustration, an exemplary process for operation 430 is illustrated in FIG. 4B.

Figure 4B:
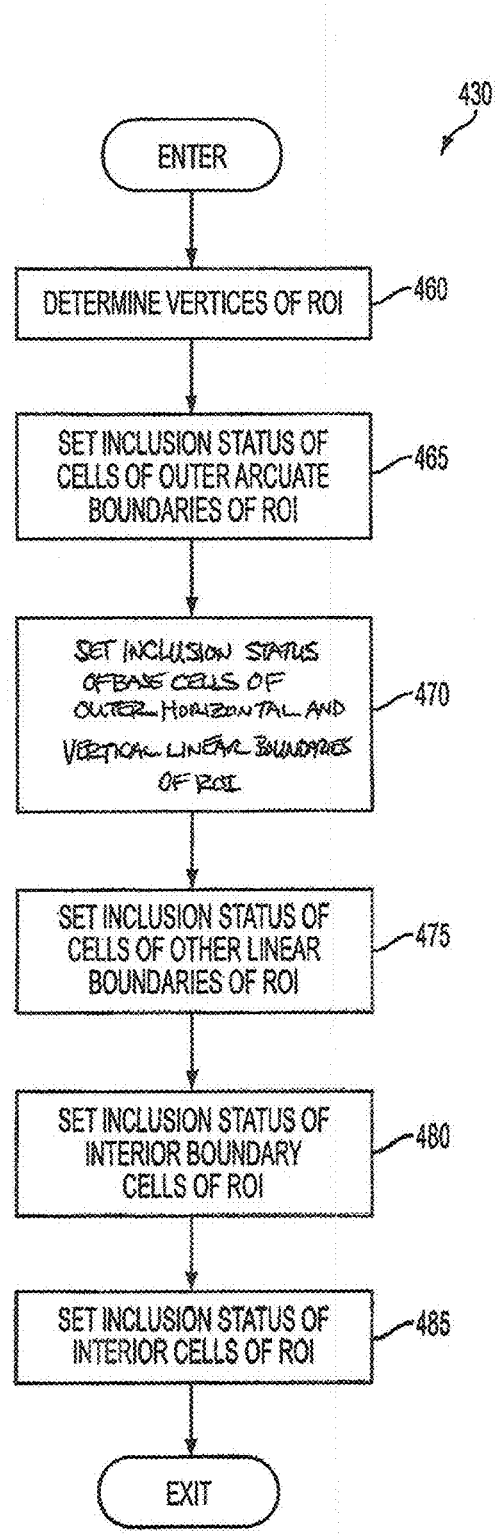
Figure 4C:
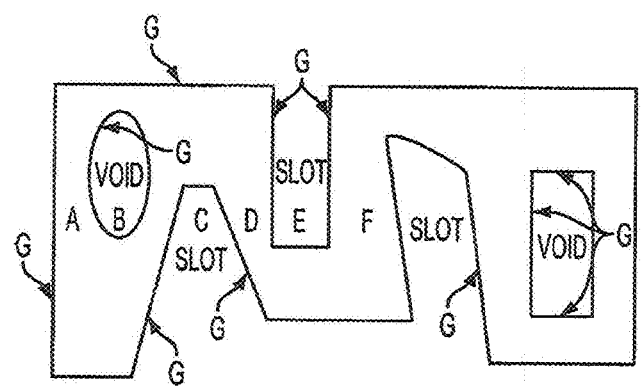
FIG. 4C illustrates exemplary interior and exterior boundaries of an ROI according to embodiments of the present general inventive concept.
Figure 7A:
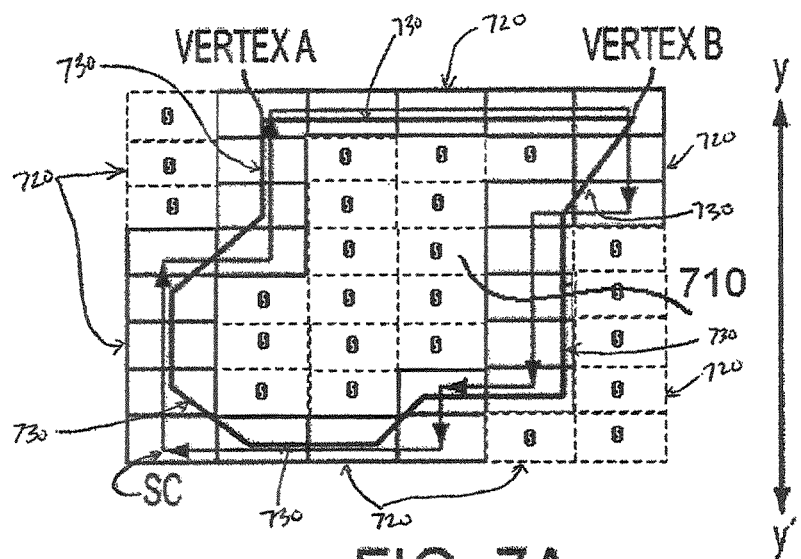
FIGS. 7A-7E are block diagrams illustrating the inclusion of base cells within an interior of a region of interest of a power plane/ground plane pair according to embodiments of the present general inventive concept.

Referring to FIG. 4B, the exemplary process 430 corresponding to operation 430 in FIG. 4A, transitions to operation 460, whereby the vertices and other transitions in the boundary shape of the ROI, all of which will be referred to herein as vertices, are determined. For example, as illustrated in FIG. 7A, a horizontal linear boundary may be formed between vertex A and vertex B. From one vertex to another vertex of the ROI, the base cells in a row define the peripheral horizontal boundary line AB if the line intersects a cell. The vertices may be determined from placement data in the layout of the power distribution circuit. The vertices may be used to demark segments of the boundary, and may be stored in a circuit object, such as a circuit object created to store data associated with the ROI, so as to be retrieved as necessary. With the vertices defined in operation 460, any cell in line with a vertex that defines an endpoint of a horizontal line may be considered to define the boundary.

Figure 5A:
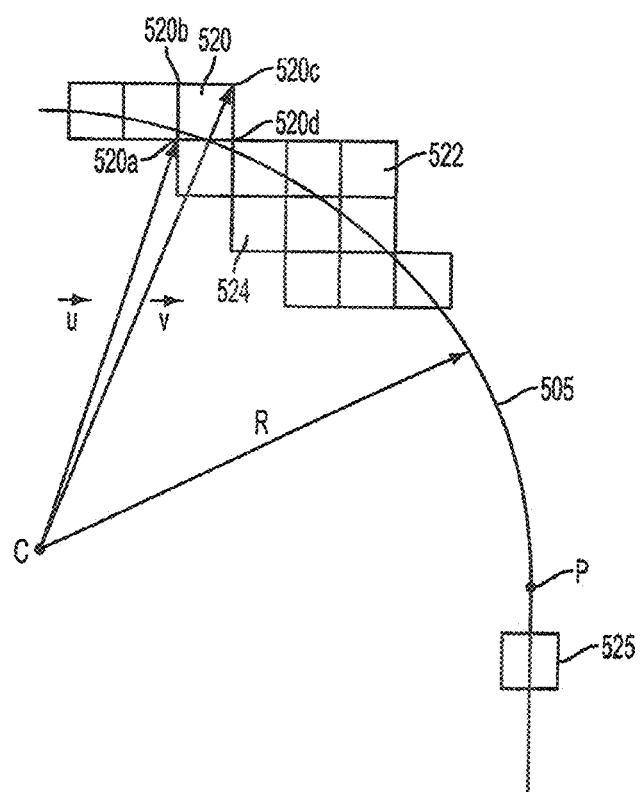
FIGS. 5A-5E are diagrams illustrating the defining of boundaries of a region of interest in cells according to embodiments of the present general inventive concept.

In operation 465, the inclusion status of base cells on arcuate boundary segments of the outer peripheral boundary are set according to whether the cell is on the peripheral boundary per predetermined inclusion criteria. An exemplary determination of whether a cell is within the peripheral boundary at arcuate segments thereof is illustrated in FIG. 5A. As illustrated in the figure, an arcuate boundary segment 505 defines an arc of radius R as measured from arc center point C. The center point C and the radius R of the boundary segment may be obtained from a circuit object containing the fabrication data for the PGPP component of which the arcuate boundary segment 505 is a part. Base cells, representatively illustrated at base cell 520, are positioned at the boundary 505 according to the mesh spacing determined in operation 425. A base cell 520 may be considered to be on the arcuate boundary segment 505 if all four corner points 520a-520d of the base cell 520 are within the region of the arcuate boundary 505 defined by the radius R and the distance from all corner points of the base cell 520 to the center of the arcuate segment is neither greater than nor less than the radius R. For example, the base cell 525 is not on the arcuate boundary 505 since it is not in the region thereof as the cell 525 is on a linear segment demarked by the transition point P. The base cell 524 is not on the arcuate boundary segment 505 since the distance from all four corner points to the center C is less than the radius R, and the base cell 522 is not on the arcuate boundary segment 505 since the distance from all four corner points thereof to the center C is greater than the radius R. Base cell 520, however, is considered to be on the arcuate boundary since the distance from the corner 520a, as determined by, for example, a vector magnitude of the vector U, is less than the radius R and the distance from at least one other corner point to the center of the arcuate segment 505, as determined by, for example, the vector magnitude of the vector V, is greater than the radius R. In the case of base cell 520, the distances from the center point C to all three remaining corner points 520b-520d are greater than the radius R.

In operation 470, the inclusion status of base cells on the horizontal and vertical linear boundaries of the ROI is set according to whether a base cell lies on the boundary to define the boundary in cells. From one vertex to another vertex of the ROI, the base cells in a row for horizontal boundaries, and in a column for vertical boundaries, define the peripheral boundary if the line intersects a cell. For example, with the location of the vertices determined in operation 460, any cell in line with a vertex that defines an endpoint of a horizontal or vertical boundary segment is considered to define the boundary. Moreover, if the edge corresponding to a horizontal or vertical boundary segment is intersected by one cell then all of the cells in the row/column, from vertex to vertex, define the horizontal or vertical boundary segment.

Figure 5B:
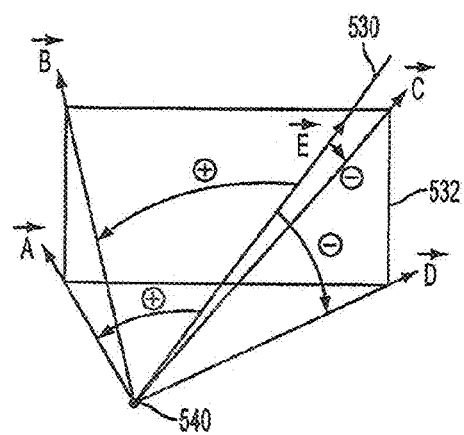
Figure 5C:
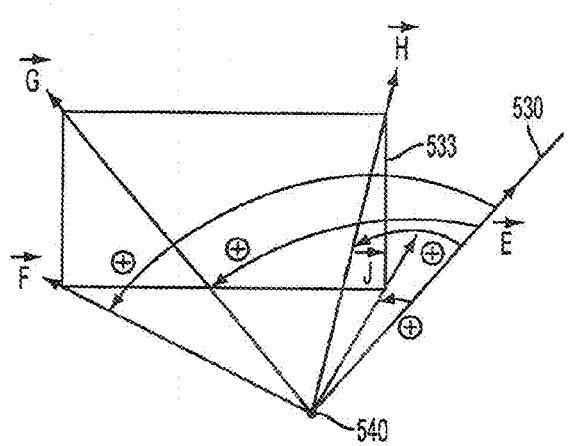

In operation 475, the inclusion status of base cells on other linear boundary segments, such as those that are aligned parallel to neither the horizontal or vertical axes, are set to define the boundary segment in base cells. Such condition is illustrated in FIGS. 5B-5E, where a diagonal peripheral boundary segment is illustrated at boundary segment 530. In certain embodiments of the present general inventive concept, whether a base cell lies on the diagonal boundary may be determined by formation of suitable vectors and the computation of a vector cross-product. For example, in FIG. 5B, a predetermined point on the boundary line 530 is selected, which is illustrated at point 540. One of the vertices defining the endpoints of the boundary segment 530 may be used as the predetermined point. A vector E may be aligned to the boundary segment 530 and four vectors A-D may be formed that each begin at the point P and are directed through respective corners of the base cell 532. If a base cell is on the boundary segment 530, such as is illustrated in FIG. 5B, the vector cross-product of the vector E with each of the vectors A-D will produce at least one result having a direction that is opposite to other cross-product results. For example, in FIG. 5B, the cross-products of the vector E with the vectors A and B produce resultant vectors in the positive z direction, whereas the cross-products of the vector E with the vectors C and D produce resultant vectors in the negative z direction. In contrast, when a base cell 533 illustrated in FIG. 5C is removed from the boundary segment 530, the cross-products of E with the vectors F-J produce respective resultant vectors that are all in the same direction. Since the determination of whether a base cell lies on the peripheral boundary 530 can be made from evaluating the direction of the resulting vector of the cross-product of the vector E with vectors passing through corner points of the base cell, certain embodiments of the present general inventive concept determine only the sign of the result as opposed to computing the complete cross-product.

Figure 5D:
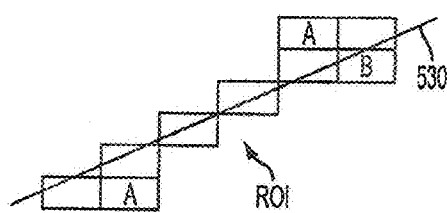
Figure 5E:
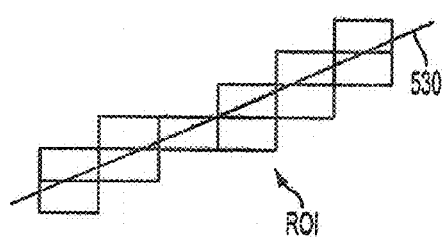

Depending on the size, mesh placement, and general shape of the base cells, as well as the position of the boundary segment, additional cells may have to be placed and evaluated so that the entire boundary segment is defined in base cells. For example, as illustrated in FIGS. 5D and 5E, diagonally oriented base cells may not correspond to the orientation of the peripheral boundary segment 530 due to the mesh placement and shape of the base cells. Thus, additional base cells may be placed, such as illustrated at cells A and B in FIG. 5D, and evaluated, such as by the cross-product computation described above, to determine whether the placed base cells are on the boundary segment 530. In FIG. 5D, the cells marked A will be determined to be remote from the boundary segment 530, whereas the cell marked B will be determined to be on the boundary segment 530. Cells may be placed and evaluated, such as by a suitable loop of processor instructions, until the boundary segment 530 is defined by base cells, such as is illustrated in FIG. 5E. Once a cell has been established as a boundary cell, an analysis object containing the cell information can set a data field indicating the status of the cell being a boundary cell.

Referring again to FIG. 4B, in operation 480, whereby internal boundaries defining, for example, voids in one or both of the power plane and the ground plane, are defined in base cells. The defining of internal boundary segments may be accomplished in a manner similar to that of external peripheral boundary segments, and a description thereof will be omitted for conciseness of the description of the present general inventive concept.

Figure 6:
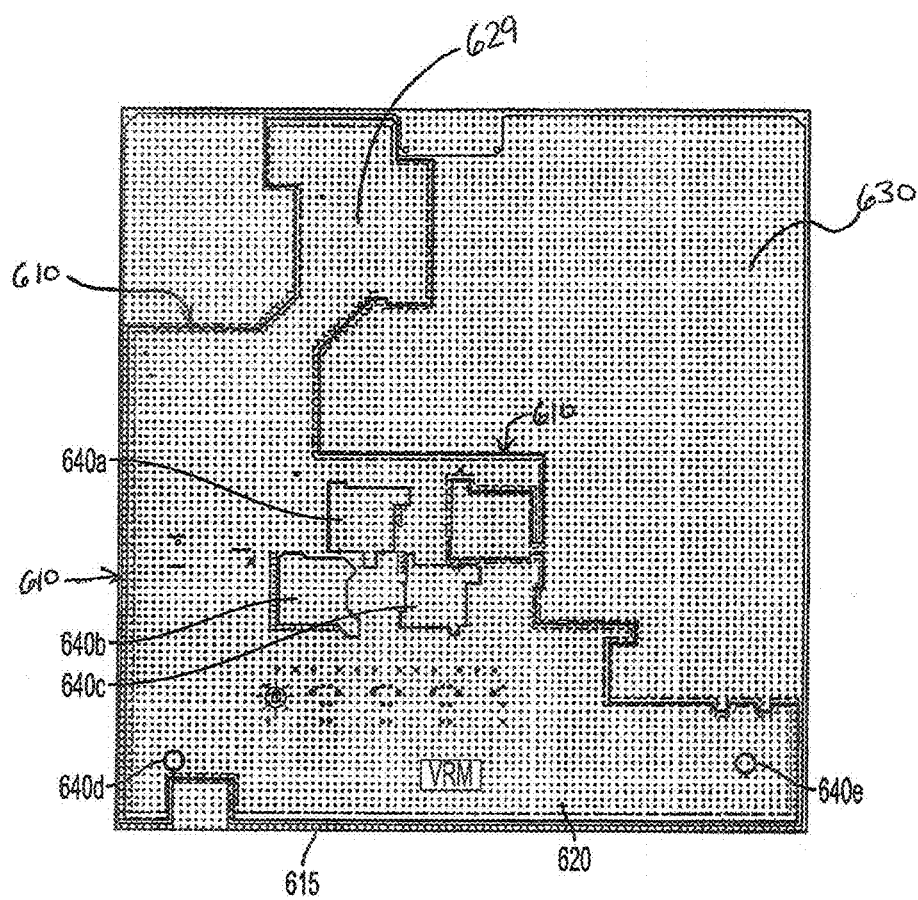
FIG. 6 is an illustration of an exemplary region of interest of a power plane/ground plane pair in which the boundaries thereof have been defined in base cells according to an embodiment of the present general inventive concept.
Figure 8:
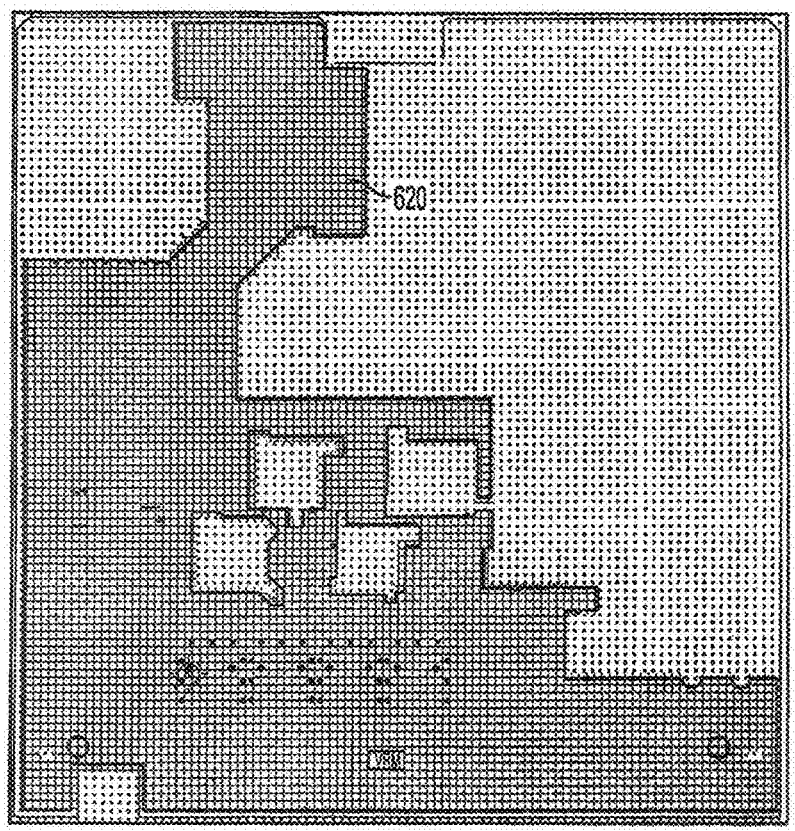
FIG. 8 is an illustration of the exemplary region of interest illustrated in FIG. 6 in which the interior thereof has been defined in base cells according to an embodiment of the present general inventive concept.

A peripheral boundary 610 as defined by base cells 615 for an ROI 620 is illustrated in FIG. 6. In the illustrated example, the ROI 620 is defined by the shape of the power plane 629, which when intersected with the ground plane 630 retains its shape. As is illustrated in FIG. 6, the boundaries of voids 640a-640e have been defined in base cells as well. The ROI 620 illustrated in FIG. 6 completely defined in base cells is illustrated in FIG. 8. It is to be understood that other techniques to establish the periphery of the ROI in base cells may be used with the present general inventive concept without deviating from the spirit and intended scope thereof.

In operation 485, the inclusion status of the cells interior to the ROI are set. An exemplary technique to set the inclusion status is illustrated in FIGS. 7A-7E.

As illustrated in FIG. 7A, the boundary cells (i.e., the cells of effective boundary 730) of the exemplary ROI 710 may be placed by the process described above, for example, and an indication that the cells are boundary cells may be contained in analysis objects of the cells. A rectangular box 720 may be established that surrounds the ROI 710 to be analyzed, and the mesh operation illustrated in FIG. 4A and described above may be performed. State values for the base cells in the ROI 710 may be initially set to a state value of "0" as illustrated in FIG. 7A. Arrowed lines indicate the loop direction around the effective boundary 730 of the ROI 710, starting at, for example, a lower-left effective boundary cell which may be referred to as the start cell ("SC"). Although the lower-left boundary cell is used as the starting point of the loop, any other suitable cell location along the effective boundary 730 may be selected as the SC.

The "loop" may be based, at least in part, on the position of the boundary cells. The "vertical position" of a boundary cell which is part of the effective boundary 730 may be moved in the y (i.e., vertical "up") or y' (i.e., vertical "down") direction. For example, as illustrated in FIG. 7B, a temporary state of "+1" may be assigned to each cell which is located to the left of a boundary cell along the effective boundary 730.

Figure 7B:
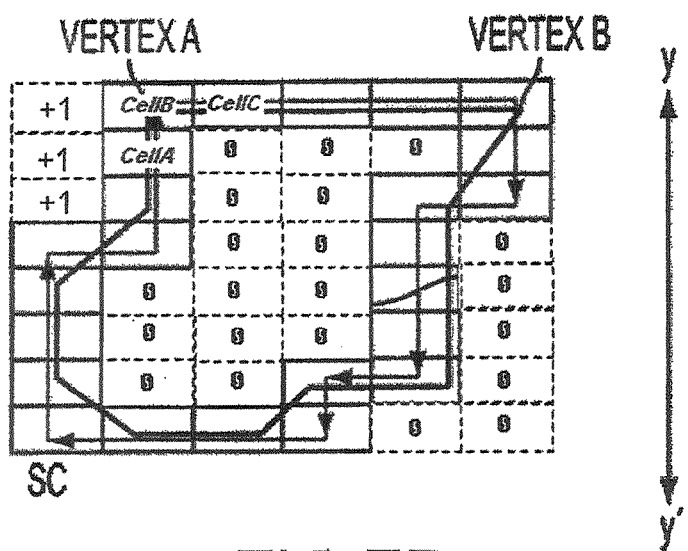

In an example using Cells A, B and C illustrated in FIG. 7B, Cell A may be greater in height in the vertical y direction than Cell B, and Cells B and C may have the same vertical height in the y direction. In moving along the arrowed loop (starting from the SC), if the former cell has the same height in the vertical y direction, the cell may not be used as an effective boundary cell. In this example, Cell A and Cell B may be used as the effective boundary cell, and Cell C may not be used as an effective boundary cell because its former boundary cell (i.e., Cell B) has the same height as Cell C. As illustrated in FIG. 7B, starting from the SC in the vertical y direction, the temporary states of cells which are to the left of the determined boundary cells are indicated with a temporary state value of +1.

Figure 7C:
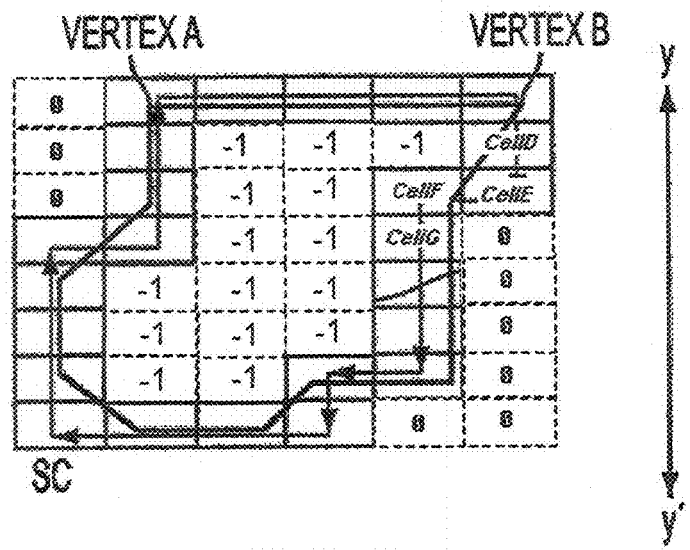

Cell D, Cell E, Cell F, and Cell G are illustrated in FIG. 7C. In this illustrated example, Cell D may be greater in vertical height than Cell E, with Cell E being equal in height when compared to Cell F, and Cell F may be greater in vertical height than Cell G. Similar to as described above, if the former cell has the same height in the vertical y' direction (vertical down), the cell may not be used as an effective boundary cell. In this example, Cell F may not be used as an effective boundary cell, as Cell F is the same size as the cell which proceeds it (i.e., Cell E) in the loop direction. As Cell D, Cell E, and Cell G have different vertical heights from the cells which preceded them, they may be used as effective boundary cells. As illustrated in FIG. 7C, the value of the temporary state for all cells on the left side of the effective boundary cells is set to −1.

Figure 7D:
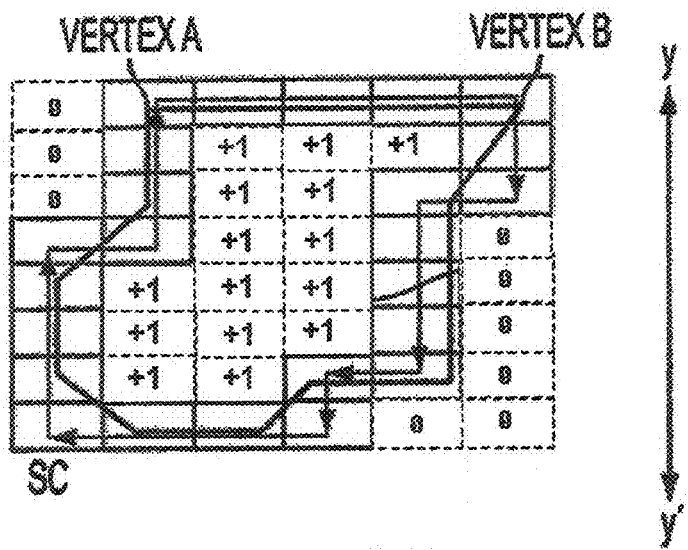

The same process may be used as described above in comparing the cells along the effective boundary 730 with one another. As illustrated in FIG. 7D, after comparing the cells along the effective boundary 730, the state of each cell may be obtained from it temporary state. When the temporary state is a non-zero value, the state of the cell may be reset as +1. Otherwise, it may be kept as a zero value.

Figure 7E:
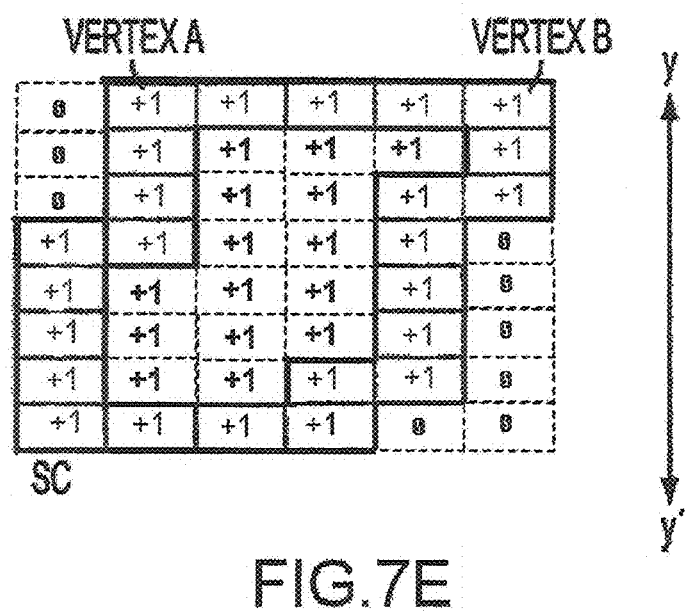

It may be determined whether a base cell is "IN" or "OUT" of the boundary, and set accordingly. Turning to FIG. 7E, the state of all the cells within (and including) the boundary may be set as +1, and these cells may be set as "IN." The status of cells outside the boundary cells may have a zero value, and may be set as "OUT."

Although this setting may be performed in both horizontal and vertical directions, at least the vertical direction may be utilized in the setting of the "IN" or "OUT" status. If the shape has voids, manufacturing anomalies, slots, or other features, a similar process may be used to determine which cells are "IN" or "OUT" of the void areas. For example, the cells on the inside of the void may have a temporary state as a non-zero value, and their status may be set as "OUT." The cells positioned outside the void may have a temporary state of 0 (zero), with the status of such cells set to "IN."

Once the ROI has been defined in base cells and the inclusion status of these cells has been set, process 400 of FIG. 4A transitions to operation 435, whereby patterns of cells are determined by the placement of the cells within and on the boundary of the ROI.

Figure 9A:
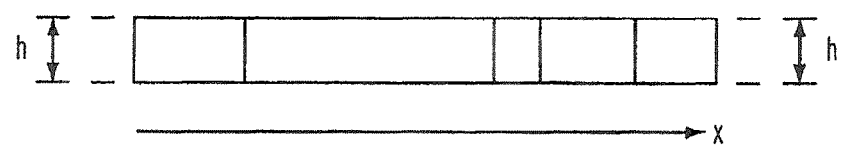
FIG. 9A illustrates an exemplary row of cells, where cells in the row may have different cell sizes but have the same width value according to embodiments of the present general inventive concept.
Figure 9B:
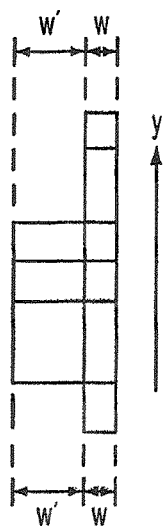
FIG. 9B illustrates an exemplary column of cells, where the cells in the column may have different cell sizes but have the same width value according to embodiments of the present general inventive concept.
Figure 9C:
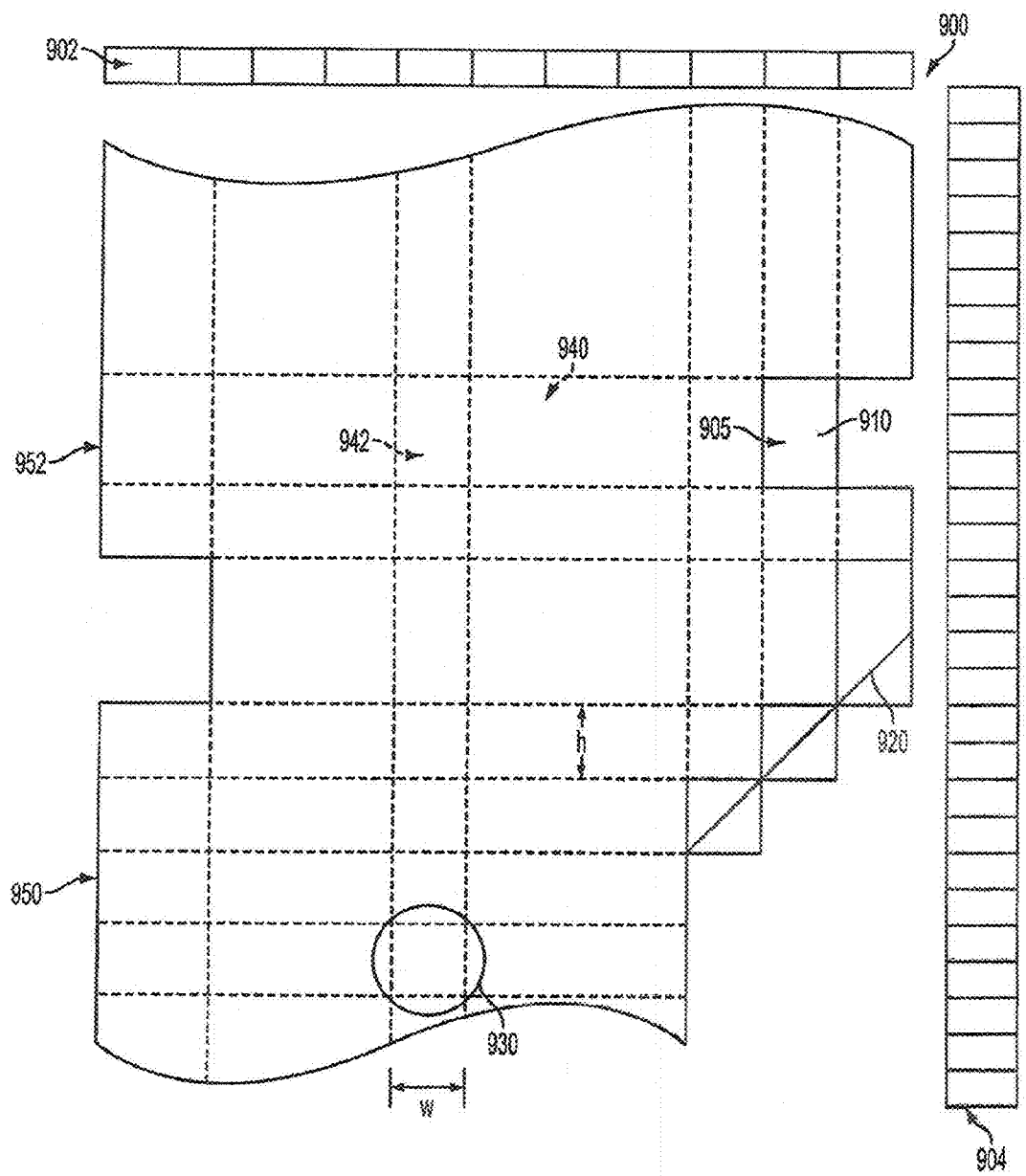
FIG. 9C is a block diagram illustrating the merging of base cells into super cells according to embodiments of the present general inventive concept.
Figure 10A:
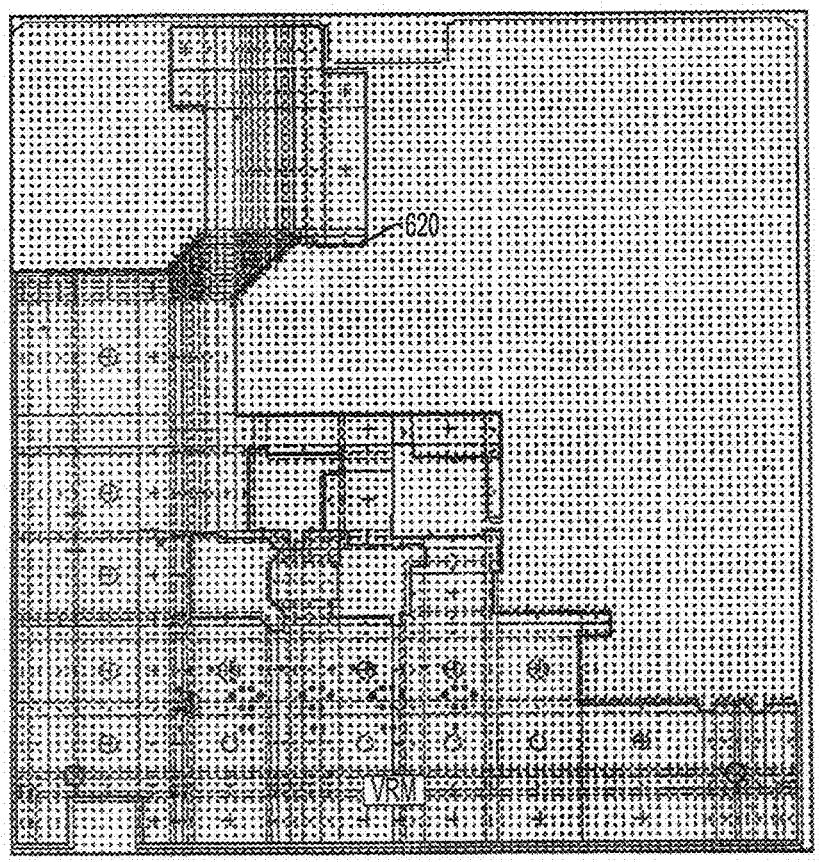
FIGS. 10A-10B are illustrations of exemplary regions of interest of a power plane/ground plane pair in which the cells thereof have been merged into super cells according to embodiments of the present general inventive concept.

An exemplary process to determine the cell pattern within the ROI is illustrated in FIGS. 9A-9C. An exemplary row of cells that may be in the ROI is illustrated in FIG. 9A, where the cells in the x direction in the cell row have the same width value h. As illustrated in FIG. 9B, the cells in the exemplary column of cells that may be in the ROI may have the same value for the width w in the y direction. FIG. 10A, which is discussed in detail below, illustrates the structure of the cell rows and columns together.

Turning to FIG. 9C, a portion of an exemplary ROI 900 having rows and columns of cells, as well as other features, is illustrated. The ROI 900 is defined by a complex peripheral boundary 950, which includes cutouts, representatively illustrated at cutout 910, and a linear boundary segment 920 that is parallel to neither axis of the exemplary coordinate system illustrated in FIG. 9C. The ROI 900 is also defined by a circular void 930.

It is to be assumed that the ROI 900 has been defined in base cells, such as by the exemplary process described above in connection with FIGS. 4A and 4B. However, to avoid congesting the figure, the scales 902 and 904 are provided exterior to the ROI 900 to indicate the placement of base cells therein in the horizontal and vertical directions.

In accordance with certain embodiments of the present general inventive concept, the cells of the ROI 900 are merged to form super cells, which may be larger than the maximum allowed sized cell, but may not be smaller than a base cell. In certain embodiments of the present general inventive concept, the patterns of cells in the ROI 900 define the largest possible super cells such that the width h in the x direction as illustrated in FIG. 9B, of all cells in a row of cells is constant, and the width w in the y direction of all cells in a column of cells is constant, where the columns and rows of cells each terminates at respective ends thereof on a boundary of the ROI 900, either on an inner boundary defining a void 930, or on the outer peripheral boundary 950.

A suitable pattern recognition process may select, for example, a boundary cell and determine the extent of the row and column in which that cell resides. Indications of the row and column may be stored in the analysis object of the cell, and a next boundary cell may be selected to determine the extent of the row and column in which that cell resides. When all of the boundary cells have been processed, patterns may be determined from common row/column structure of the cells. For example, the cells in region 940 of ROI 900 are in rows that terminate on the left at boundary segment 952 and on the right at boundary segment 905 of the cutout 910. Similarly, the cells in region 940 are in columns that terminate on the same upper and lower boundaries of the ROI. The cells in region 942 are in columns terminating at one end thereof at circular void 930. In certain embodiments of the present general inventive concept, cells in the ROI 900 in common rows and columns, i.e., rows and columns respectively terminating at common boundaries of the ROI 900 in both x and y directions, may be merged into a single super cell. The regions of commonality form a pattern which is illustrated in FIG. 9C by the grid of dashed lines.

Referring to FIG. 4A, the process 400 transitions to operation 440, whereby the cells of the ROI are merged to form super cells according to patterns determined in operation 435. A broader example is illustrated in FIG. 10A, wherein the ROI 620 illustrated in FIGS. 6 and 8 is defined in super cells.

Figure 10B:
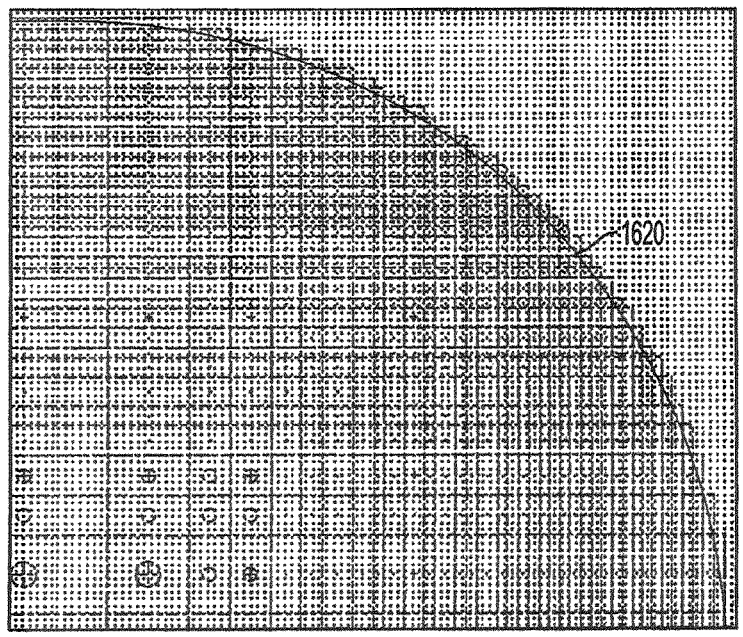

Additionally, an example of super cells defined in an ROI 1010 with an arcuate boundary 1020 is illustrated in FIG. 10B.

Figure 11:
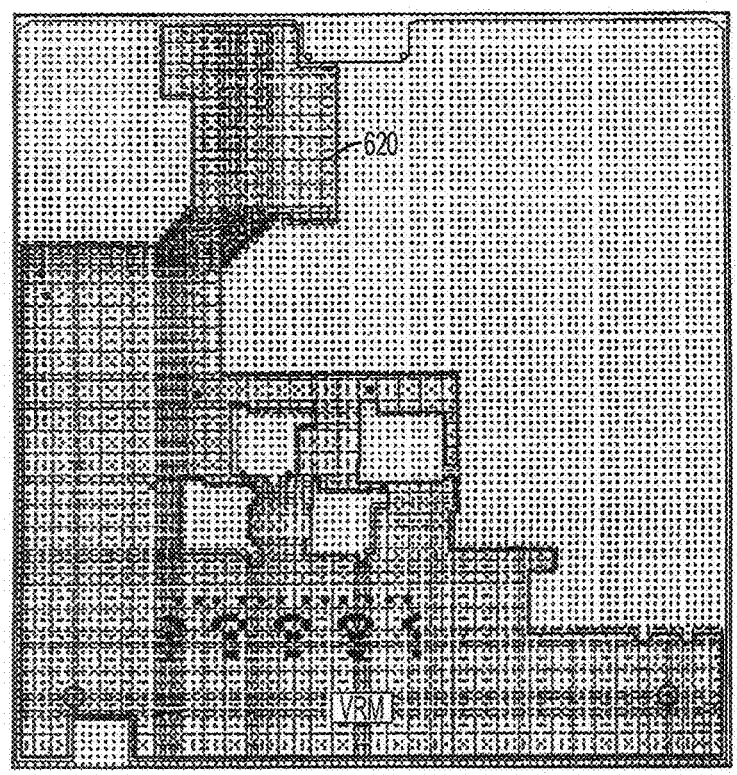
FIG. 11 is an illustration of the exemplary region of interest illustrated in FIGS. 6 and 8 with a completed adaptive mesh of cells according to an embodiment of the present general inventive concept.

In operation 445, the super cells that are greater than the maximum size are divided into cells that are no greater than the maximum size limit of the cells. Upon completion of operation 445, the adaptive mesh of cells is complete. The ROI 620 described above is illustrated in FIG. 11 as tessellated in cells that are no greater in size than a major cell and no smaller in size than a base cell. In operation 450, the mesh data are formatted for analysis, as is further described in connection with FIGS. 12A-12B and FIG. 14.

As discussed above, the adaptive mesh of the present general inventive concept may be used in a wide variety of analysis techniques. For purposes of description and not limitation, the present general inventive concept will be described in the context of power integrity (PI) analysis, and the mesh data will be formatted accordingly.

Figure 12A:
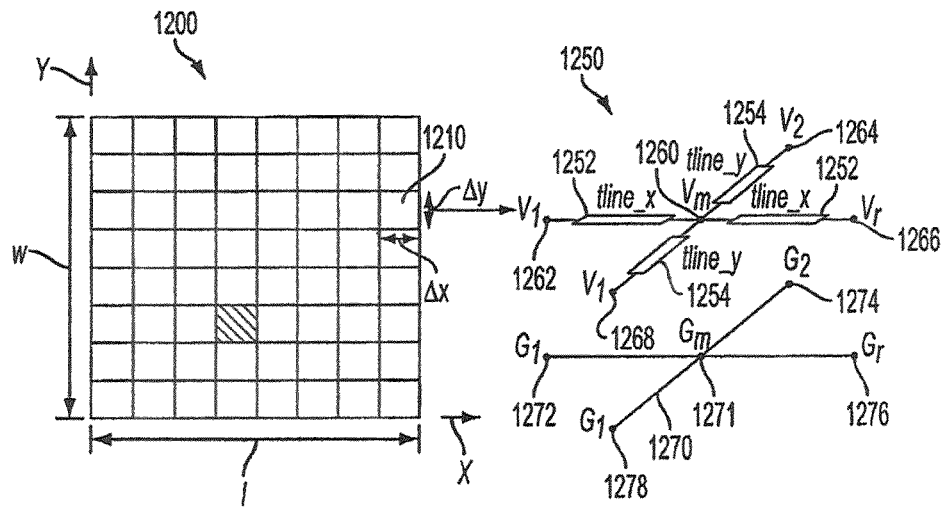
FIGS. 12A-12B are illustrations of constructing transmission line equivalent circuits in an adaptive mesh according to exemplary embodiments of the present general inventive concept.

Referring to the FIG. 12A, there is illustrated an ROI 1200 tessellated into a plurality of cells, representatively illustrated at cell 1210. The ROI 1200 may be aligned on Cartesian axes, and each cell may be defined by a length $\Delta x$ and a width $\Delta y$, such as illustrated at cell 1210. The propagation delay of the cell 1210 may be computed as:

$$T_{cell} = \begin{cases} T_{dx} = \frac{\Delta x}{c_d} \\ T_{dy} = \frac{\Delta y}{c_d} \end{cases}, \quad c_d = \frac{1}{\sqrt{\mu_0 \varepsilon_0 \varepsilon_r}}, \quad (1)$$

and the characteristic impedance of the cell may be computed as:

$$Z_{0cell} = \begin{cases} Z_{0x} = \frac{T_{dx}}{C_{cell}} \\ Z_{0y} = \frac{T_{dy}}{C_{cell}} \end{cases}, \quad C_{cell} = \frac{\varepsilon_0 \varepsilon_r \Delta x \Delta y}{d}, \quad (2)$$

where $c_d$ is the speed of light in the medium separating the PGPP, $C_{cell}$ is an equivalent capacitance of the cell, d is the distance between the power plane and the ground plane, $\varepsilon_0$ and $\mu_0$ are the permittivity and permeability of free space, respectively, and $\varepsilon_r$ is the relative permittivity of the medium between planes of the PGPP. It is to be noted that the characteristic impedance of individual cells is defined by the dimensions of the cell, and all other parameters are common to all cells.

In certain embodiments of the present general inventive concept, an equivalent transmission line model, such as illustrated at circuit model 1250 is constructed, wherein each cell 1250 is modeled by a pair of transmission line segments 1252 in the x direction and a pair of transmission line segments 1254 in the y direction. The transmission line segments 1252 and 1254 are interconnected with each other at a mesh point 1260 and with other similar models in the mesh at points 1262-1268, as will be described further below. As is illustrated in FIG. 12A, the transmission line model 1250 includes a ground plane model 1270 having mesh point 1271, and interconnection nodes 1272-1278 corresponding to interconnection nodes 1262-1268, respectively. The propagation delay of each transmission line segment 1252, 1254 may be computed as:

$$T_{tline\_x} = \frac{T_{dx}}{2\sqrt{2}} \quad (3)$$

$$T_{tline\_y} = \frac{T_{dy}}{2\sqrt{2}}, \quad (4)$$

and the characteristic impedance of each transmission line segment 1252, 1254 may be computed as:

$$Z_{0tline\_x} = \frac{2Z_{0x}}{\sqrt{2}} \quad (5)$$

$$Z_{0tline\_y} = \frac{2Z_{0y}}{\sqrt{2}}. \quad (6)$$

In equations (3)-(6), a correction factor of $$\frac{1}{\sqrt{2}}$$

has been applied so that the delay and characteristic impedance of the cell corresponds to the delay and characteristic impedance of the transmission line model. Additionally, since the transmission line model 1250 is based on a pair of transmission line segments 1252, 1254 in each direction, the delay of one segment is half the total delay of the pair, and the characteristic impedance of each segment 1252, 1254 is doubled.

Figure 12B:
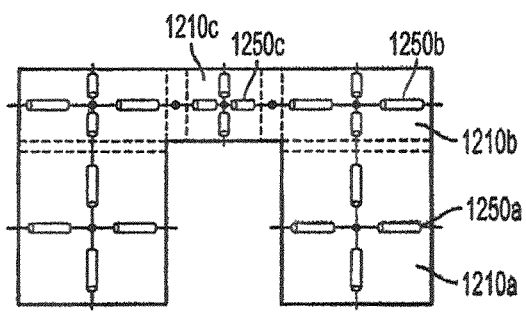

The transmission line model 1250 of each cell 1210 may be interconnected to form a mesh of transmission line equivalent circuits 1250a-1250c, such as illustrated in FIG. 12B, having characteristic parameters defined by the dimension of the respective cells 1210a-1210c. The data corresponding to the mesh of equivalent circuits 1250a-1250c may be formatted by, for example, the mesh data processor 370 in FIG. 3B according to the requirements of the analyzer, such as the analyzer 375. For example, the mesh data may be formatted into a suitable netlist defining the interconnections and characteristic impedances of the mesh of equivalent circuits 1250a-1250c to provide to a transmission line simulator, such as HSpice with the "w" element model parameter. The present general inventive concept is not limited to the analysis data format or the analysis performed therewith.

Figure 1B:
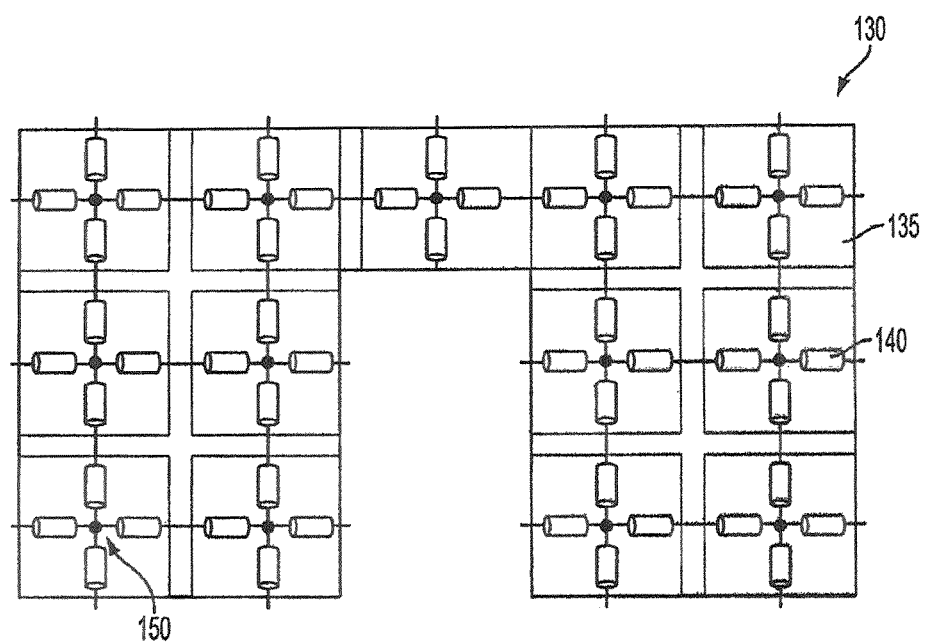
FIG. 1B is an illustration of a conventional mesh of transmission line equivalent circuits to model frequency characteristics of a power plane/ground plane pair according to conventional techniques.
Figure 13:
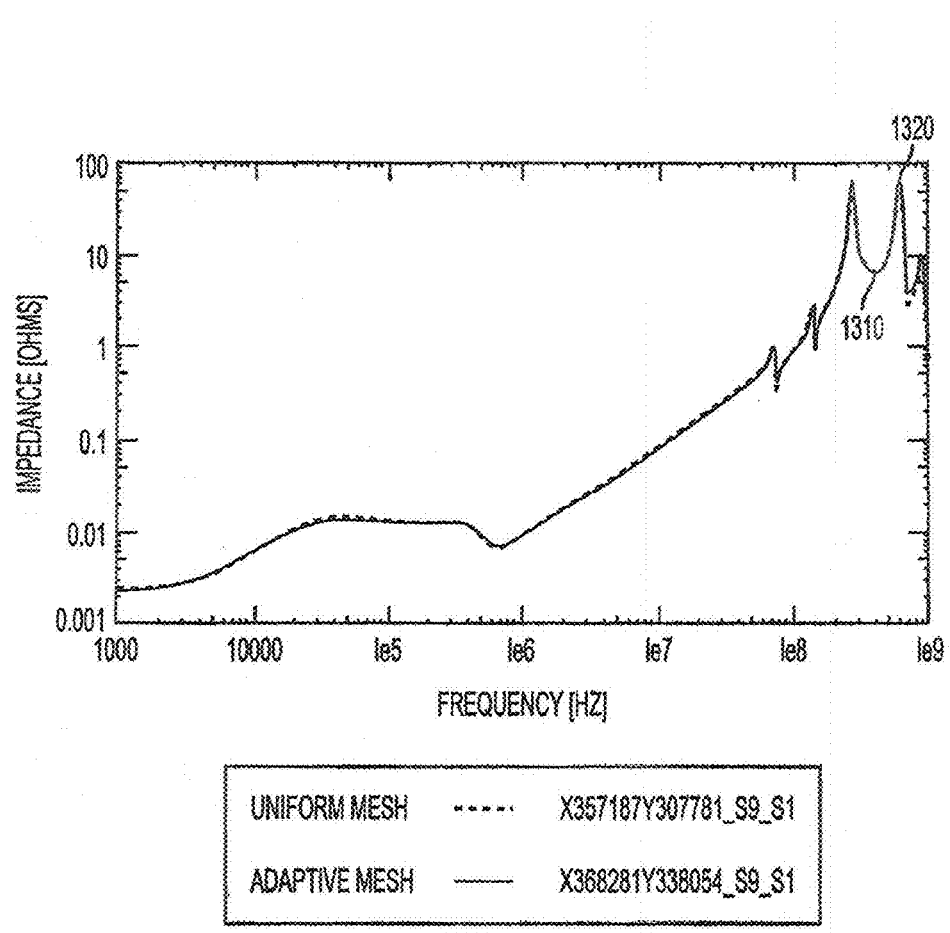
FIG. 13 is a graph illustrating the difference in accuracy in frequency response analysis of a uniform mesh and an adaptive mesh according to exemplary embodiments of the present general inventive concept.

The data reduction of the present general inventive concept is apparent by comparing the number of mesh points of the mesh illustrated in FIG. 12B with the number of mesh points of the mesh illustrated in FIG. 1B. Beneficially, the data reduction achieved by the present general inventive concept does not significantly affect the accuracy of the analysis results. FIG. 13 illustrates a comparison of simulated frequency response of impedance in a uniform mesh, depicted by line 1310, of transmission line equivalent circuit models with the adaptive mesh thereof, depicted by line 1320, according to an embodiment of the present general inventive concept. The uniform mesh simulated was of a 64×64 grid of cells having the same size, and the adaptive mesh simulated was of a 8×8 level 8 grid having the minimum sized cell equal to the uniform mesh cell. Both responses were taken from substantially collocated probing points and reveal substantially equivalent results. The simulation of the uniform mesh in the example of FIG. 13 was completed in 12 minutes, whereas, beneficially, the simulation of the adaptive mesh according to the embodiment of the present general inventive concept was complete in only 40 seconds.

Figure 14:
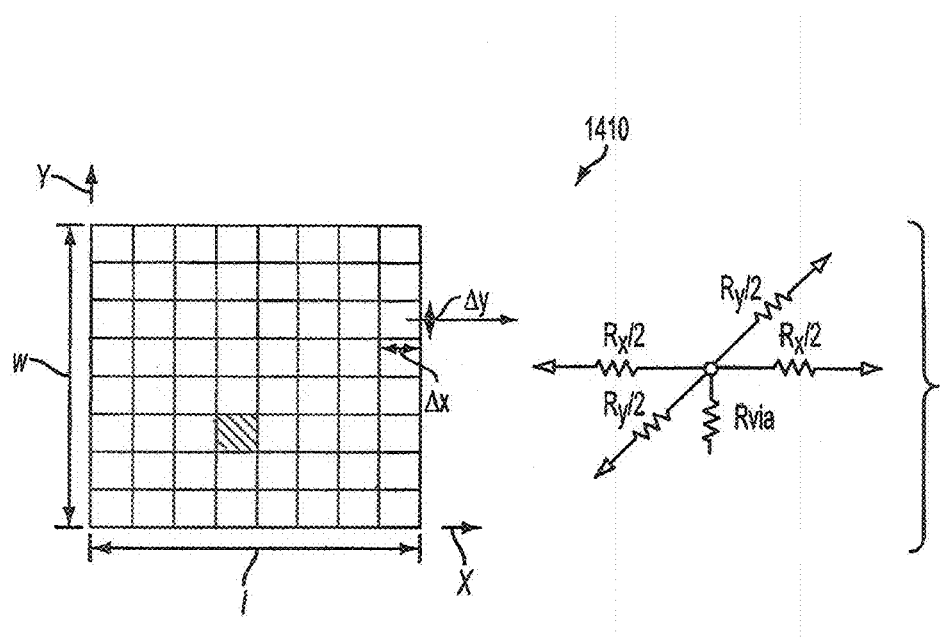
FIG. 14 is an illustration of constructing resistive equivalent circuits in an adaptive mesh according to exemplary embodiments of the present general inventive concept.

The present general inventive concept may also be used to perform static IR drop analysis. The resistance for rectangular cells can be scaled according to the dimensions of the cell in a manner similar to the transmission line analysis application. For example, once the adaptive mesh has been established, equivalent resistive circuit models 1410 may be constructed as illustrated in FIG. 14, by which:

$$R_x = \frac{\Delta x}{\sigma \Delta y t} \quad (7)$$

$$R_y = \frac{\Delta y}{\sigma \Delta x t} \quad (8)$$

Figure 15:
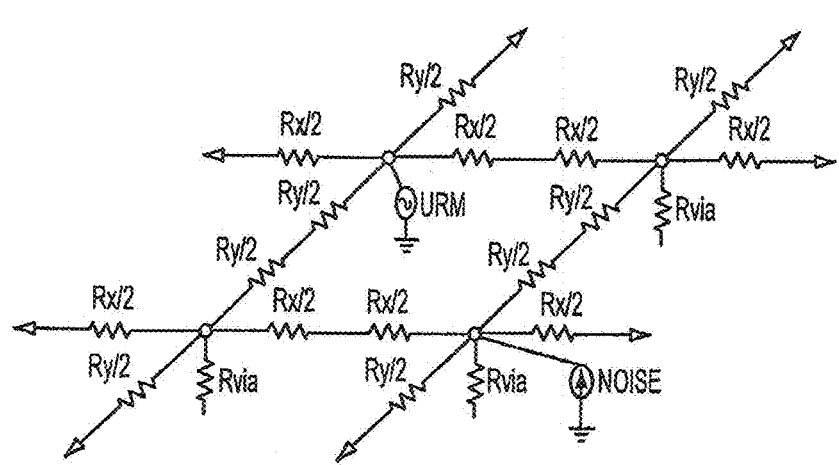
FIG. 15 is an illustration of an exemplary network of resistive equivalent circuits in an adaptive mesh according to exemplary embodiments of the present general inventive concept.

In equations (7)-(8), $\sigma$ denotes the conductivity of the conductor in Siemens/meter and t is the effective thickness of the conductor, which, to obtain the DC resistance, is the thickness of conductor illustrated in FIG. 2C. The resistive models 1410 may be interconnected in a manner similar to the transmission line models, as illustrated in FIG. 15, and a suitable netlist may be formatted for IR drop analysis. From the netlist, a matrix equation can be obtained applying Kirchhoff's Current Law:

$$[G][V]=[I], \quad (9)$$

where [G] is the conductance matrix, [I] is the injected current vector and [V] is the voltage vector at each node. The matrix [G] can be formed from elements having values equivalent to the reciprocal values of resistances. The dimensions of the matrix dimension are determined by the number of circuit nodes other than those nodes connected to a voltage regulator module (VRM). For example, in a circuit corresponding to four cells as illustrated in FIG. 15, equation (9) becomes:

$$\begin{bmatrix} g_{total1} & -g_1 & 0 \\ -g_2 & g_{total2} & -g_3 \\ 0 & -g_3 & g_{total3} \end{bmatrix} \begin{bmatrix} V_1 \\ V_2 \\ V_3 \end{bmatrix} = \begin{bmatrix} 0 \\ I_2 \\ 0 \end{bmatrix}. \quad (10)$$

The non-diagonal element is the conductance between the two nodes while the diagonal element will be the sum of all non-diagonal element at that row and the conductance between the two nodes (current node and its adjacent node) if the adjacent node is connected to one VRM. On each row, there will be at most six elements. The injected current vector [I] will be one zero vector except for those nodes with current noise source. Namely, the current value at that row of current vector will be filled with current value. The $g_{totali}$ (e.g., $g_{total1}$, $g_{total2}$, $g_{total3}$, etc.) is the sum of the conductance value $g_i$ (e.g., $g_1$, $g_2$, $g_3$, etc.) which is the result from the resistors that may be connected to the node I (e.g., node 1, node 2, node 3, etc.).

Figure 16:
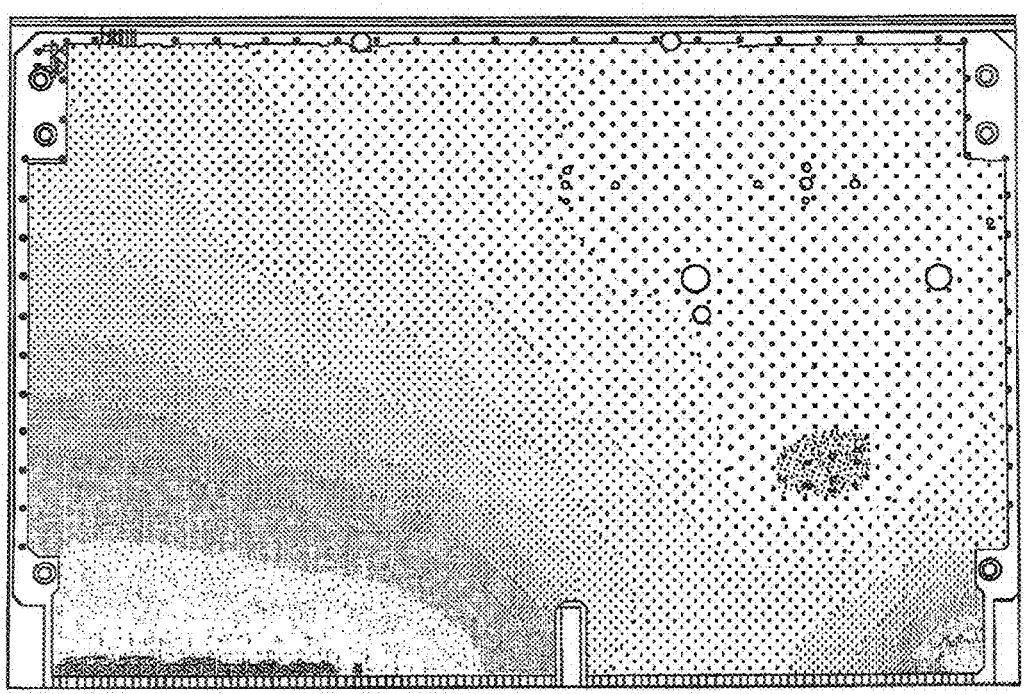
FIG. 16 is an illustration of a distribution of simulated voltage drop across a resistive model of a power plane/ground plane pair using an adaptive mesh of resistive equivalent circuit models according to exemplary embodiments of the present general inventive concept.

Having created the sparse matrix equation, the sparse matrix solution is adopted to calculate the voltage vector [V]. This computed result is used to define the voltage drop on each meshed cell center, referencing the VRM location. Exemplary results as illustrated in FIG. 16, where it is observed that the voltage drop varies across the power plane.

When one or more power planes have power vias connected together, the SQPI may consider the effect of such vias. The power vias located at one or more defined cells may connect to centers of at least two cells on, for example, two adjacent power planes. The resistance for the via, $R_{via}$ (e.g., illustrated in FIGS. 14 and 15), may be determined by the equation $$R_{via} = \frac{d}{\sigma \pi (r_1^2 - r_0^2)}$$

where $r_1$, $r_0$ are the dimension of out and inner radius of via and d is the dimension between two power planes. Values for the resistance of Rx and Ry, illustrated in FIGS. 14 and 15, may be determined using above-listed equations (7) and (8).

Certain embodiments of the present general inventive concept provide for the functional components to manufactured, transported, marketed and/or sold as processor instructions encoded on computer-readable media. The present general inventive concept, when so embodied, can be practiced regardless of the processing platform on which the processor instructions are executed and regardless of the manner by which the processor instructions are encoded on the medium.

It is to be understood that the computer-readable medium described above may be any medium on which the instructions may be encoded and then subsequently retrieved, decoded and executed by a processor, including electrical, magnetic and optical storage devices, and wired, wireless, optical and acoustical communication channels. The computer readable medium may include either or both of persistent storage, referred to herein as "computer-readable recording media" and as spatiotemporal storage, referred to herein as "computer-readable transmission media". Examples of computer-readable recording media include, but not limited to, read-only memory (ROM), random-access memory (RAM), and other electrical storage; CD-ROM, DVD, and other optical storage; and magnetic tape, floppy disks, hard disks and other magnetic storage. The computer-readable recording media may be distributed across components, to include such distribution through storage systems interconnected through a communication network. The computer-readable transmission media may transmit encoded instructions on electromagnetic carrier waves or signals, or as acoustic signals through acoustically transmissive media. Moreover, the processor instructions may be derived from algorithmic constructions of the present general inventive concept in various programming languages, the mere contemplation of which illustrates the numerous realizable abstractions of the present general inventive concept.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A method of adaptive mesh resolution for analysis of a plane pair of an electronic circuit having a power plane and a ground plane, the method comprising:

Generating, using a computer, a first size for a first cell structure of a first region of the plane pair;

adaptively generating, using the computer, a second size for a second cell structure based on a shape of a second region of the plane pair and determining a scaling factor between the first size and the second size; and meshing, using the computer, the first cell structure and the second cell structure horizontally and vertically, wherein a first center node of the first cell structure is aligned with a second center node of the second cell structure, such that grid nodes stay aligned along length and width to allow parameters of equivalent circuit models to be scaled appropriate to the cell size;

wherein meshing the first cell structure and the second cell structure horizontally and vertically comprises:
determining patterns of the second cell structures according to boundaries of a region of interest (ROI);
merging only the second cell structures of the ROI to form one or more super cells according to the determined patterns, wherein the height of all cells in a row of cells is constant and the width of all cells in a column of cells is constant; and
dividing the one or more super cells that are greater in size than the first size of the first cell structures into one or more third cell structures having a third size that is less than or equal to the first cell structures.

2. The method of claim 1, further comprising:
determining the transmission line characteristics of each cell based on the scaling factor.

3. The method of claim 1, further comprising:
determining the impedance of the plane pair.

4. The method of claim 1, further comprising:
setting a target impedance;
determining an impedance at a location in the plane pair; and
placing a decoupling device to reduce impedance in the location when the determined impedance is greater than the target impedance.

5. The method of claim 1, further comprising:
performing power integrity analysis on the meshed structure of cells.

6. The method of claim 1, further comprising:
performing static IR (current-resistance) drop analysis on the meshed structure of cells.

7. A method of adaptive mesh resolution for analysis of a plane pair of an electronic circuit having a power plane and a ground plane, the method comprising:
setting a first number of first cell structures having a first size for the pair plane in an x-direction and a second number of the first cell structures in a y-direction;
setting a level for the first cell structures, wherein the level is the number of second cell structures having a second size that can be divided from the first cell structure having the first size, with the second size being less than the first size;
determining the number of second cell structures having the second size in the x-direction and the y-direction, the second cell structures being a subdivision of the first cell structures;
using a computer, identifying a plurality of second cell structures on each boundary of a region of interest (ROI), wherein a second cell structure is marked as on a boundary if the second cell structure includes at least a portion of the boundary;
using the computer, computing the number of first cell structures that will completely populate the ROI and the number of second cell structures that will completely populate the ROI; and
determining, using the computer, a mesh of the second cell structures in the ROI;
wherein meshing the first cell structure and the second cell structure horizontally and vertically comprises:
determining patterns of the second cell structures according to boundaries of a region of interest (ROI);
merging only the second cell structures of the ROI to form one or more super cells according to the determined patterns, wherein the height of all cells in a row of cells is constant and the width of all cells in a column of cells is constant; and
dividing the one or more super cells that are greater in size than the first size of the first cell structures into one or more third cell structures having a third size that is less than or equal to the first cell structures.

8. The method of claim 7, wherein the determining the maximum and minimum mesh spacing comprises:
determining the minimum mesh spacing by calculating the number of the second cell structures having the second size to populate the ROI in the x- and y-directions; and
determining the maximum mesh spacing by calculating the number of the first cell structures having the first size to populate the ROI in the x- and y-directions.

9. The method of claim 7, further comprising:
formatting data of the mesh for analysis.

10. The method of claim 9, wherein the formatting the data further comprises:
formatting the data for power integrity (PI) analysis.

11. The method of claim 9, wherein the formatting the data further comprises:
formatting the data for static IR (current-resistance) drop analysis.

12. The method of claim 7, further comprising:
representing the pair of planes by a mesh of transmission lines; and
for each of the second cell structures, determining an equivalent transmission line network by determining the delay and impedance from the dimensions of the second cell structures.

13. The method of claim 7, wherein the determining a mesh of second cell structures in the ROI further comprises:
determining the vertices of the ROI; and
setting an inclusion status of the second cell structures of the ROI.

14. A method of adaptive mesh resolution for analysis of a plane pair of an electronic circuit having a power plane and a ground plane, the method comprising:
setting a first number of first cell structures having a first size for the pair plane in an x-direction and a second number of the first cell structures in a y-direction;
setting a level for the first cell structures, wherein the level is the number of second cell structures having a second size that can be divided from the first cell structure having the first size, with the second size being less than the first size;
determining the number of second cell structures having the second size in the x-direction and the y-direction, the second cell structures being a subdivision of the first cell structures;
using a computer, identifying a plurality of second cell structures on each boundary of a region of interest (ROI), wherein a second cell structure is marked as on a boundary if the second cell structure includes at least a portion of the boundary;
using the computer, computing the number of first cell structures that will completely populate the ROI and the number of second cell structures that will completely populate the ROI; and
determining, using the computer, a mesh of the second cell structures in the ROI;
wherein the determining a mesh of second cell structures in the ROI further comprises:
determining the vertices of the ROI; and
setting an inclusion status of the second cell structures of the ROI;

wherein the setting an inclusion status of the second cell structures further comprises:

setting an inclusion status of the second cell structures of at least one outer arcuate boundary of the ROI, wherein the arcuate boundary is characterized by a center and a radius R, and wherein a second cell structure is marked as being on the arcuate boundary unless the distances from all corners of the second cell structure are greater than R or the distances from all corners of the second cell structure are less than R;

setting an inclusion status of the second cell structures of a horizontal and vertical boundary of the ROI;

setting an inclusion status of the second cell structures of a linear boundary of the ROI, wherein the linear boundary is characterized by a first vector extending from a reference point on the linear boundary, and the second cell structure is characterized by a plurality of vectors extending from the reference point to each corner of the second cell structure, wherein the second cell structure is marked as being on the linear boundary unless all cross-products between the first vector and each of the plurality of vectors are in the same direction;

setting an inclusion status of the second cell structures of an interior boundary of the ROI; and setting an inclusion status of the second cell structures of an interior of the ROI.

15. A non-transitory computer readable medium containing computer readable instructions thereon, that, when executed by a processor, performs a method of adaptive mesh resolution for analysis of a plane pair of an electronic circuit having a power plane and a ground plane, the method comprising:

generating a first size for a first cell structure of a first region of the plane pair;

adaptively generating a second size for a second cell structure based on a shape of a second region of the plane pair and determining a scaling factor between the first size and the second size; and meshing the first cell structure and the second cell structure horizontally and vertically, wherein a first center node of the first cell structure is aligned with a second center node of the second cell structure meshing the first cell structure and the second cell structure horizontally and vertically, wherein a first center node of the first cell structure is aligned with a second center node of the second cell structure, such that grid nodes stay aligned along length and width to allow parameters of equivalent circuit models to be scaled appropriate to the cell size;

wherein meshing the first cell structure and the second cell structure horizontally and vertically comprises:

merging the second cell structures to form one or more super cells according to the determined patterns, wherein the height of all cells in a row of cells is constant and the width of all cells in a column of cells is constant; and dividing the one or more super cells that are greater in size than the first size of the first cell structures into one or more third cell structures having a third size that is less than or equal to the first cell structures.

\* \* \* \* \*